(12) United States Patent
Lee et al.

(10) Patent No.: US 7,867,883 B2
(45) Date of Patent: Jan. 11, 2011

(54) METHODS OF FABRICATING NON-VOLATILE MEMORY DEVICES

(75) Inventors: Chang-Hyun Lee, Gyeonggi-do (KR); Jung-Dal Choi, Gyeonggi-do (KR); Chang-Seok Kang, Gyeonggi-do (KR); Jin-Taek Park, Gyeonggi-do (KR); Byeong-In Choe, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 55 days.

(21) Appl. No.: 12/146,653

(22) Filed: Jun. 26, 2008

(65) Prior Publication Data
US 2009/0001451 A1 Jan. 1, 2009

(30) Foreign Application Priority Data
Jun. 26, 2007 (KR) .................. 10-2007-0063052

(51) Int. Cl.
*H01L 21/425* (2006.01)
*H01L 29/06* (2006.01)

(52) U.S. Cl. .............. 438/525; 438/527; 257/623; 257/E21.619; 257/E21.377

(58) Field of Classification Search .............. 438/525, 438/527; 257/623, E21.619, E21.377
See application file for complete search history.

(56) References Cited

U.S. PATENT DOCUMENTS

| | | | |
|---|---|---|---|
| 6,218,265 B1 | 4/2001 | Colpani | |
| 6,413,843 B1 * | 7/2002 | Hara | ............... 438/525 |
| 7,416,948 B2 * | 8/2008 | Kraft et al. | ............... 438/270 |
| 2004/0169238 A1 | 9/2004 | Lee et al. | |
| 2004/0256683 A1 * | 12/2004 | Lee et al. | ............... 257/412 |
| 2006/0113522 A1 * | 6/2006 | Lee et al. | ............... 257/18 |
| 2006/0180851 A1 | 8/2006 | Lee et al. | |
| 2006/0234431 A1 * | 10/2006 | Yeo et al. | ............... 438/157 |
| 2007/0004107 A1 * | 1/2007 | Lee et al. | ............... 438/157 |
| 2008/0054361 A1 * | 3/2008 | Siprak | ............... 257/365 |
| 2008/0057644 A1 * | 3/2008 | Kwak et al. | ............... 438/257 |

FOREIGN PATENT DOCUMENTS

| | | |
|---|---|---|
| JP | 2000-188345 A | 7/2000 |
| JP | 2000-216270 * | 8/2000 |
| JP | 2005-268418 A | 9/2005 |
| KR | 10-2003-0014761 A | 2/2003 |
| KR | 1020050032437 A | 4/2005 |
| KR | 102006134757 A | 12/2006 |

* cited by examiner

*Primary Examiner*—Hsien-ming Lee
*Assistant Examiner*—Kevin Parendo
(74) *Attorney, Agent, or Firm*—Myers Bigel Sibley & Sajovec, P.A.

(57) ABSTRACT

A method of fabricating a semiconductor device includes forming a fin-shaped active region including opposing sidewalls and a surface therebetween protruding from a substrate, forming a gate structure on the surface of the active region, and performing an ion implantation process to form source/drain regions in the active region at opposite sides of the gate structure. The source/drain regions respectively include a first impurity region in the surface of the active region and second impurity regions in the opposing sidewalls of the active region. The first impurity region has a doping concentration that is greater than that of the second impurity regions. Related devices are also discussed.

13 Claims, 48 Drawing Sheets

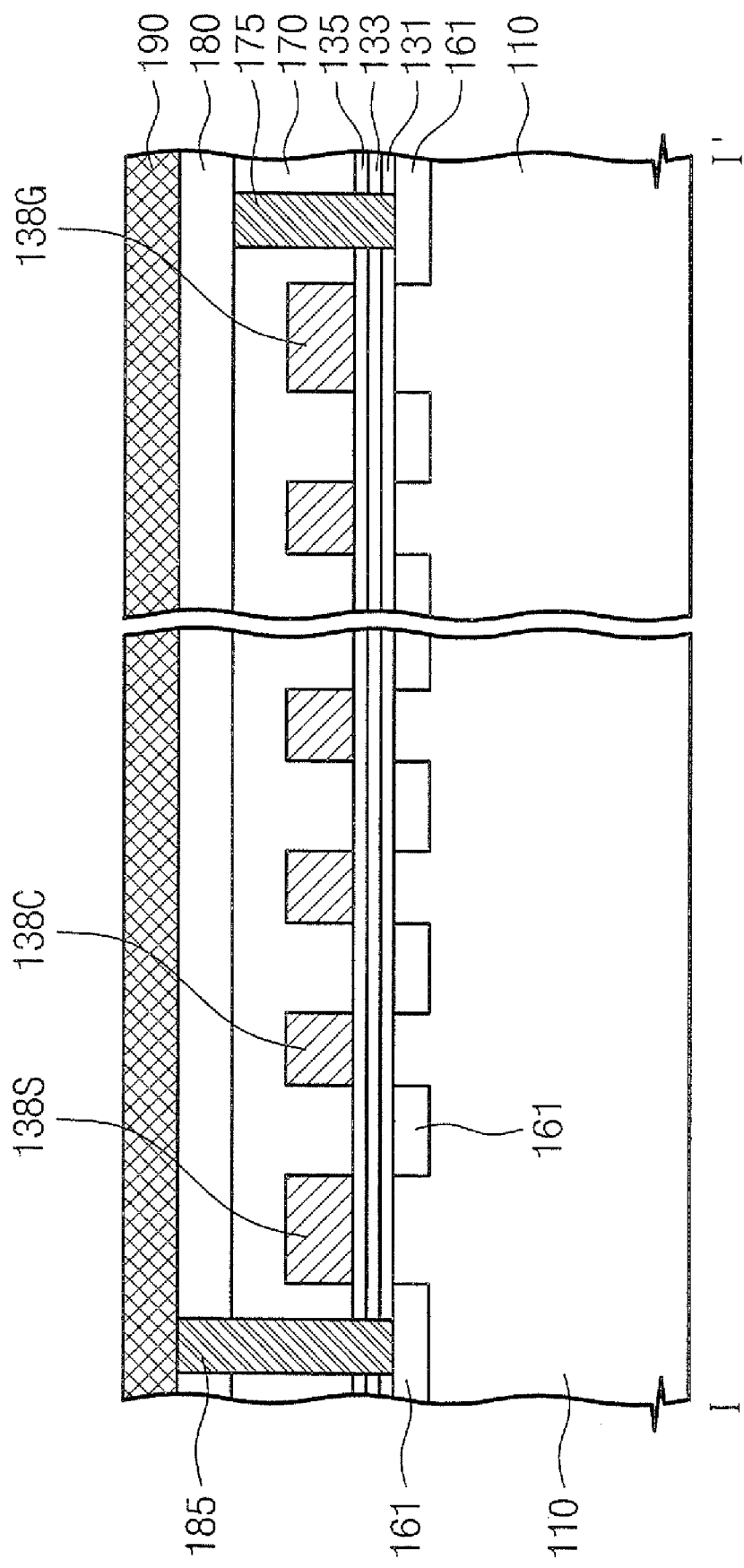

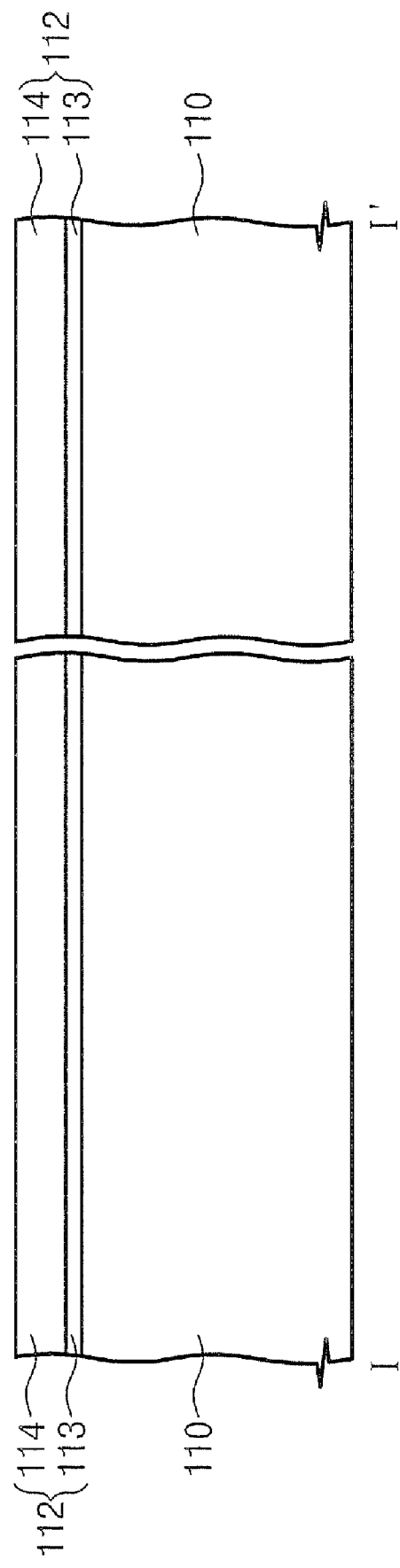

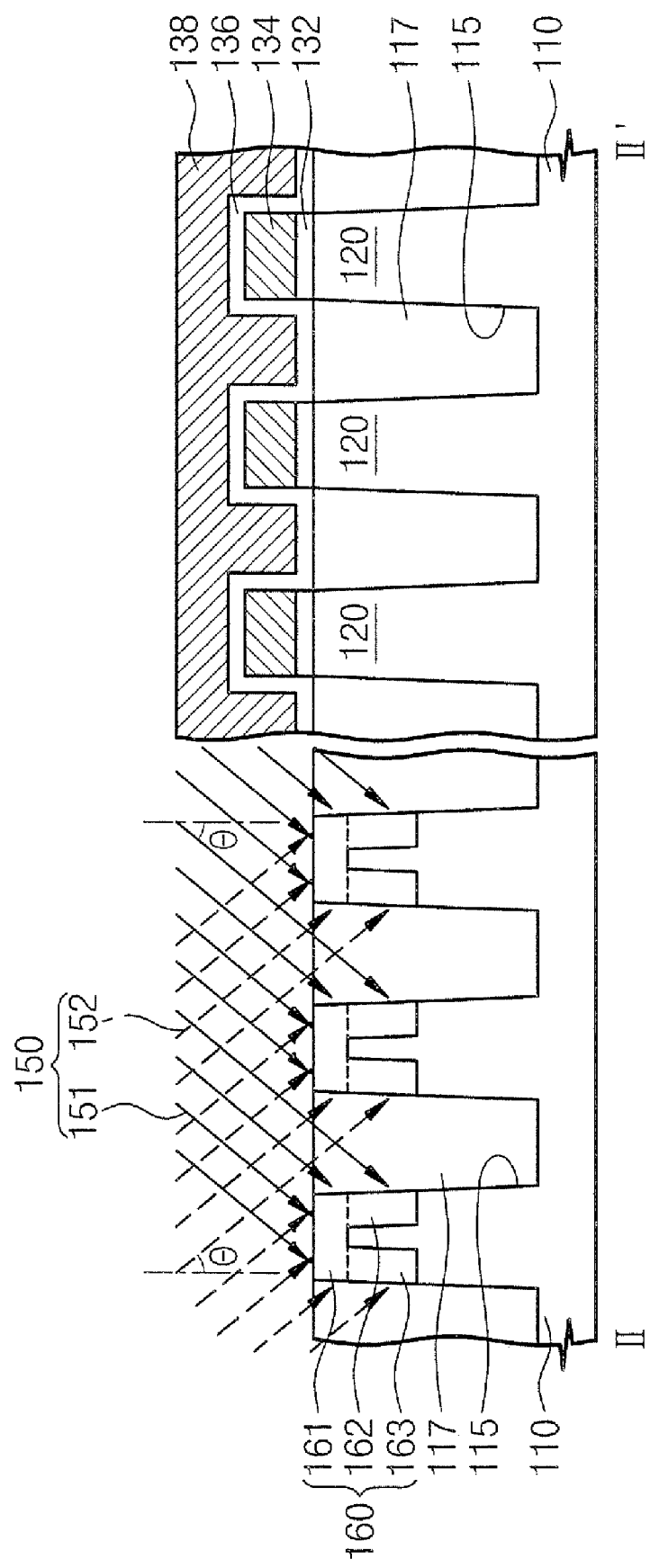

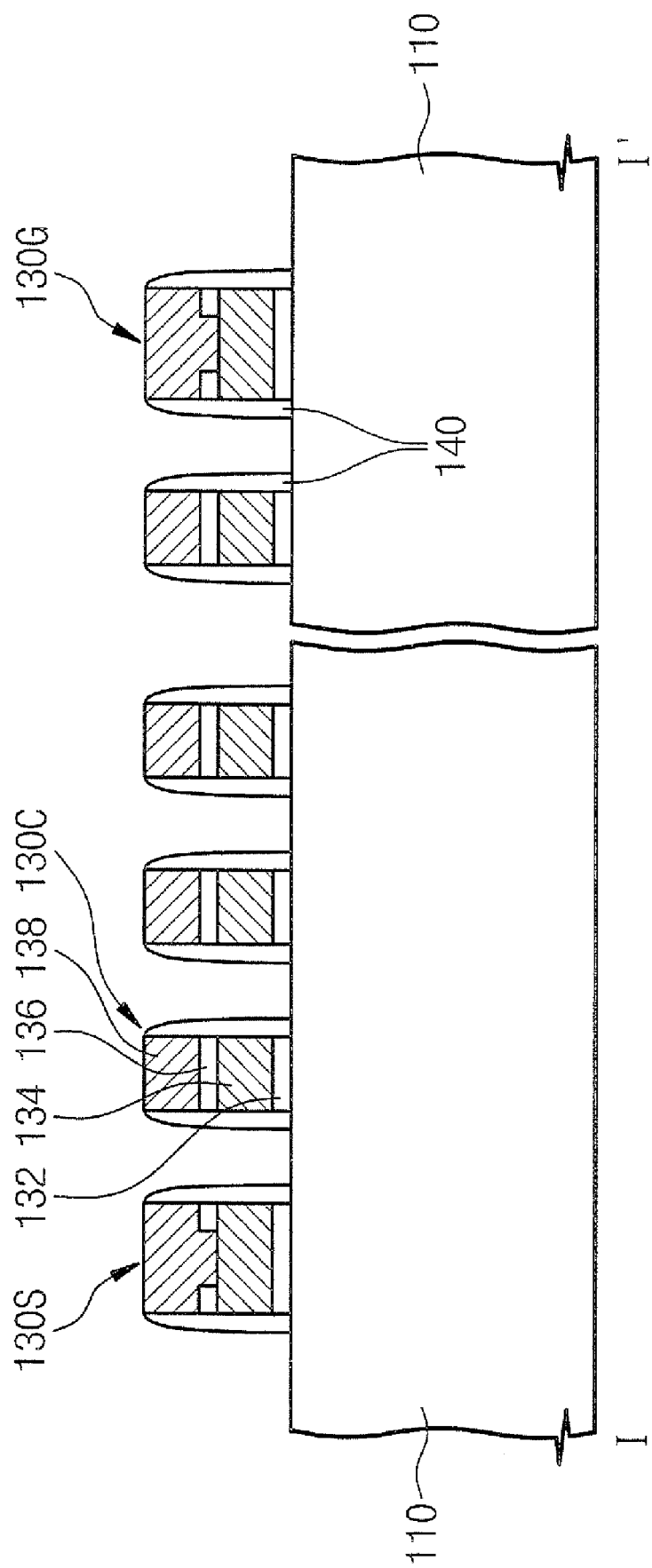

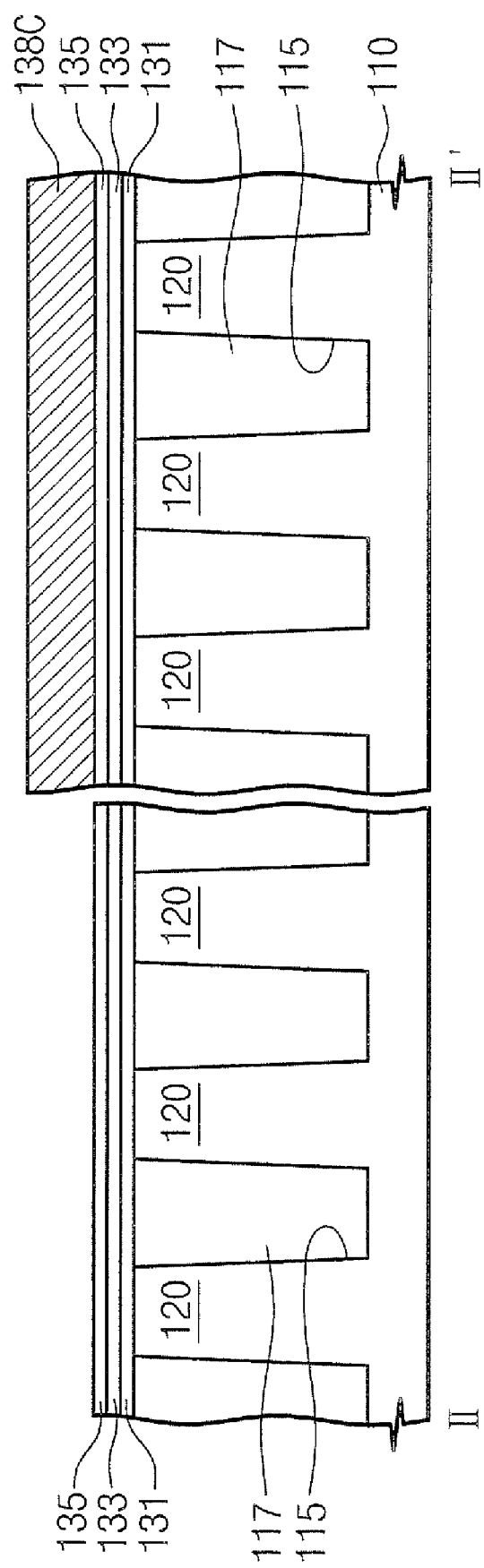

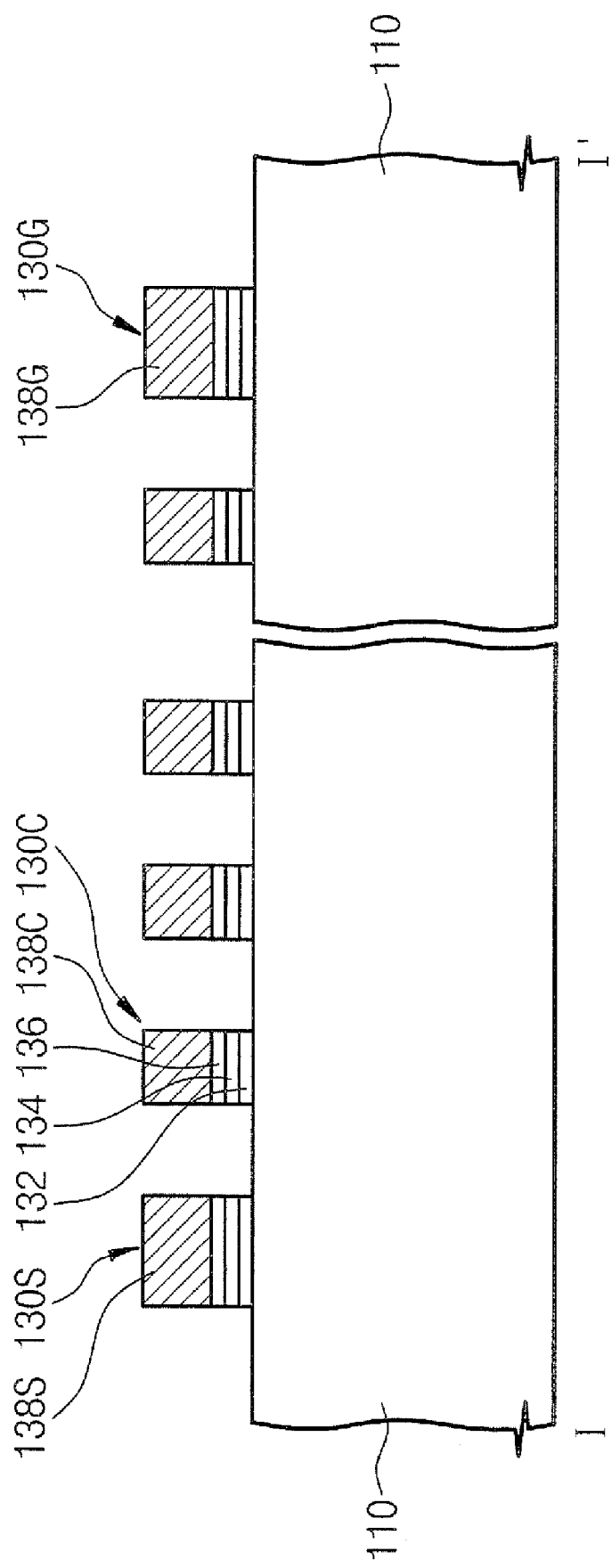

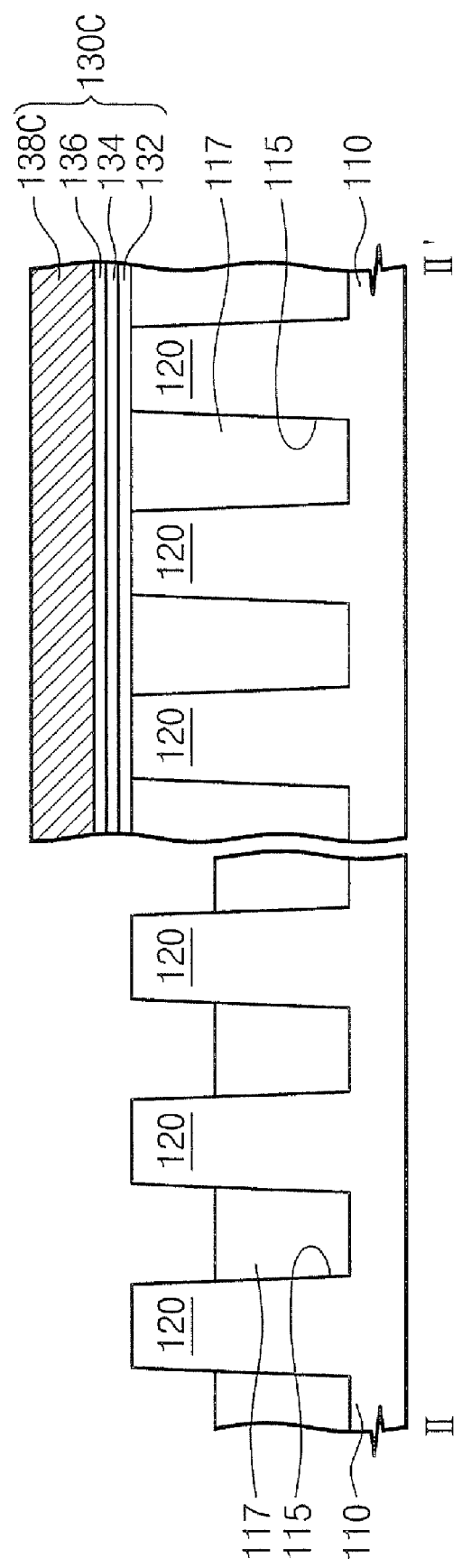

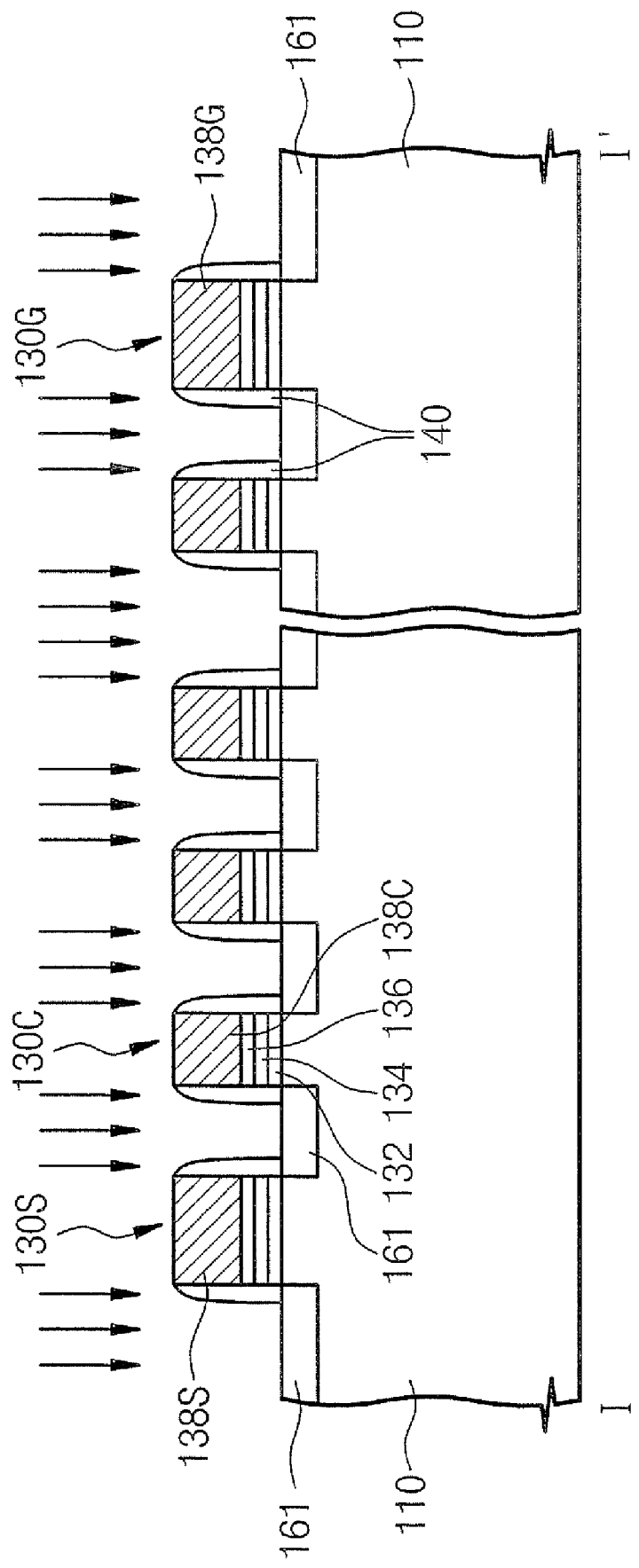

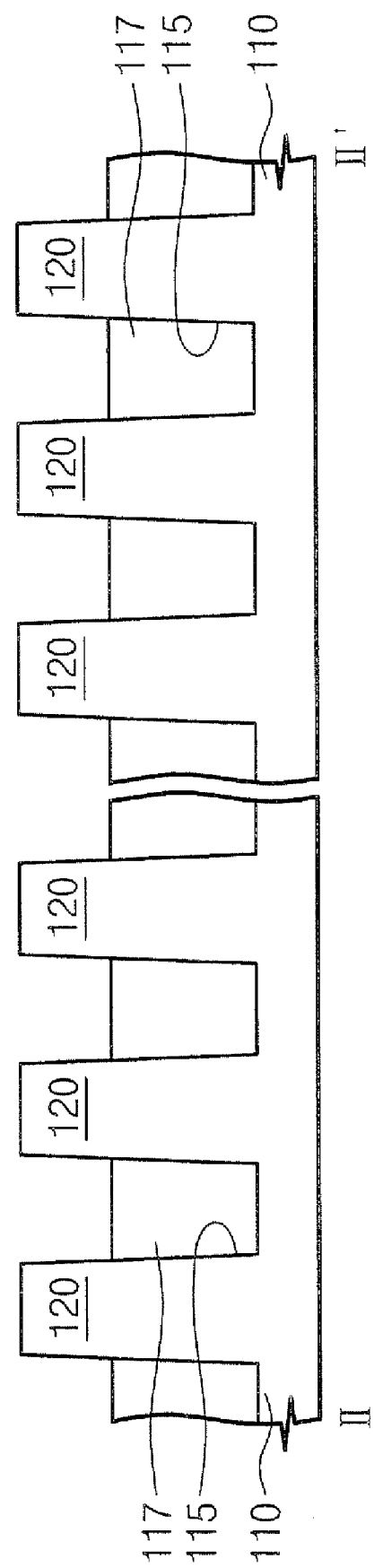

METHODS OF FABRICATING NON-VOLATILE MEMORY DEVICES

CROSS-REFERENCE TO RELATED APPLICATIONS

This U.S. non-provisional patent application claims priority under 35 U.S.C. §119 from Korean Patent Application No. 10-2007-0063052, filed on Jun. 26, 2007, the disclosure of which is hereby incorporated by reference herein in its entirety.

FIELD OF THE INVENTION

The present invention relates to semiconductor devices, and more particularly, to non-volatile memory devices and methods of fabricating the same.

BACKGROUND OF THE INVENTION

Generally, a semiconductor memory device can be classified as a volatile memory device or a non-volatile memory device. A volatile memory device may lose its stored information when no power is applied, while a non-volatile memory device may retain its stored information even when there is no power. A flash memory device is a non-volatile memory device. Types of flash memory devices include NOR flash memory devices and NAND flash memory devices. A NOR flash memory device can independently control each memory cell, and thus, may have a relatively fast operational speed. However, because a NOR flash memory device may require at least one contact for every two cells, such a device may have a relatively large cell area. In contrast, a NAND flash memory device can control one string including a plurality of memory cells, and thus, may be advantageously used to achieve greater device integration.

A NAND flash memory device may include a substrate that has an active region extending in a predetermined direction. A string select line and a ground select line may be disposed on the substrate to cross over the active region, and a plurality of word lines may be disposed between the select lines. Source/drain regions may be disposed on the active region between the word lines and the select lines.

However, as memory devices have become more highly integrated, an area of the source/drain regions may be reduced. Accordingly, reliability and/or operational characteristics of NAND flash memory devices may be deteriorated. For example, if a program voltage or a pass voltage is applied to word lines to prevent program inhibit of a memory cell connected to a bit line, an electric field of a channel may be increased. Therefore, a depletion layer or region of the channel may expand, and a depletion layer of the source/drain region may also expand. Accordingly, an effective area of the source/drain region may be reduced. If an area of the source/drain regions becomes sufficiently small, the channels of the memory cells may be disconnected due to the reduction in the area of the source/drain regions.

SUMMARY OF THE INVENTION

According to some embodiments of the present invention, a semiconductor device includes a fin-shaped active region including opposing sidewalls and a surface therebetween protruding from a substrate, a gate structure on the surface of the active region, and source/drain regions in the active region at opposite sides of the gate structure. The source/drain regions respectively include a first impurity region in the surface of the active region, and second impurity regions in the opposing sidewalls of the active region. The first impurity region has a doping concentration that is greater than that of the second impurity regions.

According to other embodiments of the present invention, a non-volatile memory device includes a memory layer, the memory layer including: an active region defined by a device isolation layer in a substrate and extending in a first direction; a control gate line crossing over the active region and extending in a second direction, the second direction intersecting the first direction; a charge storage layer interposed between the active region and the control gate line; and source/drain regions disposed in the active regions at both sides of the control gate line, wherein the source/drain regions include a first impurity region and second impurity regions, the first impurity region being disposed in an upper portion of the active region, the second impurity regions being disposed in both sides of the active region below the first impurity region.

In some embodiments, the first impurity region may have a first doping concentration and the second impurity region may have a second doping concentration. The second doping concentration may be less than the first doping concentration.

In other embodiments, the first doping concentration may be two or more times greater than the second doping concentration.

In some embodiments, the source/drain regions may include a cross section defining an inverted "U"-shape.

In other embodiments, a top surface of the device isolation layer exposed between the control gate lines may be lower than a top surface of the active region and higher than a bottom surface of the second impurity region. For example, the second impurity regions may extend towards the substrate beyond a surface of the device isolation layer.

In some embodiments, the charge storage layer may include a conductive layer pattern. The conductive layer pattern may define an island shape on the active region.

In other embodiments, the charge storage layer may include an insulation layer.

In some embodiments, the memory layer may further include a plurality of stacked memory layers.

In other embodiments, the non-volatile memory devices may further include a contact and a common source line. The contact may electrically connect the drain regions of each of the memory layers, and the common source line may electrically connect the source regions of each of the memory layers.

According to further embodiments of the present invention, an electronic device includes: a controller; an input/output device; an interface; and a non-volatile memory device; wherein the controller, the input/output device, the interface, and the non-volatile memory device are connected by a bus. The non-volatile memory device includes: a device isolation layer defining an active region extending in a first direction; a control gate line crossing over the active region and extending in a second direction, the second direction intersecting the first direction; a charge storage layer interposed between the active region and the control gate line; and source/drain regions disposed in the active regions at both sides of the control gate line, wherein the source/drain regions include a first impurity region and second impurity regions, the first impurity region being disposed in an upper portion of the active region, the second impurity regions being disposed in both sides of the active region below the first impurity region.

According to still other embodiments of the present invention, a method of fabricating a semiconductor device includes forming a fin-shaped active region including opposing sidewalls and a surface therebetween protruding from a substrate, forming a gate structure on the surface of the active region, and forming source/drain regions in the active region at opposite sides of the gate structure. The source/drain regions respectively include a first impurity region in the surface of the active region and second impurity regions in the opposing sidewalls of the active region. The first impurity region has a doping concentration that is greater than that of the second impurity regions.

According to still further embodiments of the present invention, a method of fabricating a non-volatile memory device includes: forming a device isolation layer on a substrate to define an active region extending in a first direction; forming a control gate line and a charge storage layer, the control gate crossing over the active region and extending in a second direction intersecting the first direction, the charge storage layer being interposed between the active region and the control gate line; and performing an ion implantation process to form source/drain regions in the active region at both sides of the control gate line, wherein the source/drain regions include a first impurity region and second impurity regions, the first impurity region being disposed in an upper portion of the active region, the second impurity regions being disposed in both sides of the active region below the first impurity region.

In some embodiments, the ion implantation process may include implanting impurity ions at an angle of greater than 0 degrees with respect to a direction perpendicular to the substrate and toward the second direction.

In other embodiments, performing the ion implantation process may include: performing a first ion implantation process to implant first impurity ion into a first one of the opposing sidewalls of the active region; and performing a second ion implantation process to implant second impurity ions into a second one of the opposing sidewall of the active region. Ones of the first and second impurity ions implanted into the surface of the active region may define the first impurity region, and ones of the first and second impurity ions implanted into the opposing sidewalls of the active region may define the second impurity regions.

In some embodiments, the first impurity ions and the second impurity ions may be implanted at the same angle of incidence. In other embodiments, the first impurity ions and the second impurity ions may be implanted substantially similar but opposite angles of incidence.

In still other embodiments, before performing the ion implantation process, the method may further include recessing the device isolation layer at both sides of the control gate line to expose portions of the opposing sidewalls of the active region.

In some embodiments, the angle of incidence may be greater than 0° and less than tan−1(Y/X), where X may be a distance between a top surface of the active region and a top surface of the recessed device isolation layer, and where Y may be a width of the recessed device isolation layer along the second direction.

In other embodiments, forming the control gate line and the charge storage layer may include: forming a conductive pattern extending in the first direction on the active region interposing a first insulation layer between the active region and the conductive pattern; forming a conductive layer interposing a second insulation layer between the conductive pattern and the conductive layer; and patterning the conductive layer, the second insulation layer, the conductive pattern, and the first insulation layer to form a gate structure including a conductive line, a second insulation layer pattern, a floating gate, and a first insulation layer pattern.

In some embodiments, the method may further include: forming spacer masks on sidewalls of the gate structure; and recessing the device isolation layer between the spacer masks using the spacer masks as an etching mask to expose portions of the opposing sidewalls of the active region.

In other embodiments, the spacer masks may include a material having an etch selectivity with respect to the device isolation layer. The device isolation layer may be recessed using a wet etching process.

In some embodiments, forming the control gate line and the charge storage layer may include: forming a first insulation layer, a charge storage insulation layer, and a second insulation layer on the active region and the device isolation layer; forming a conductive layer on the second insulation layer; and then patterning the conductive layer to form a conductive line.

In other embodiments, forming the control gate line and the charge storage layer may further include patterning the second insulation layer, the charge storage insulation layer, and the first insulation layer using the conductive line as an etching mask to form a gate structure including the conductive line, a second insulation layer pattern, a charge storage insulation layer pattern, and a first insulation layer pattern.

In some embodiments, the method may further include: forming spacer masks on opposing sidewalls of the gate structure; and recessing the device isolation layer between the spacer masks by using the spacer mask as an etching mask to expose portions of the opposing sidewalls of the active region.

In other embodiments, the spacer masks may include a material having an etch selectivity with respect to the device isolation layer, and recessing the device isolation layer may be performed using a wet etching process.

BRIEF DESCRIPTION OF THE FIGURES

FIG. 4A is sectional view taken along a line I-I' of FIG. 1

FIG. 4B is sectional view taken along a line II-II' of FIG. 1, for illustrating a non-volatile memory device according to yet further embodiments of the present invention;

FIGS. 9A to 13A are sectional views taken along a line I-I' of FIG. 1 and FIGS. 4B to 13B are sectional views taken along a line II-II' of FIG. 1, for illustrating a method of fabricating a non-volatile memory device according to some embodiments of the present invention;

FIGS. 14A and 15A are sectional views taken along a line I-I' of FIG. 1 and

FIGS. 22A to 24A are sectional views taken along a line I-I' of FIG. 1 and FIGS. 22B to 24B are sectional views taken along a line II-II' of FIG. 1, for illustrating a method of fabricating a non-volatile memory device according to still further embodiments of the present invention.

DETAILED DESCRIPTION OF EMBODIMENTS OF THE INVENTION

Figure 1:
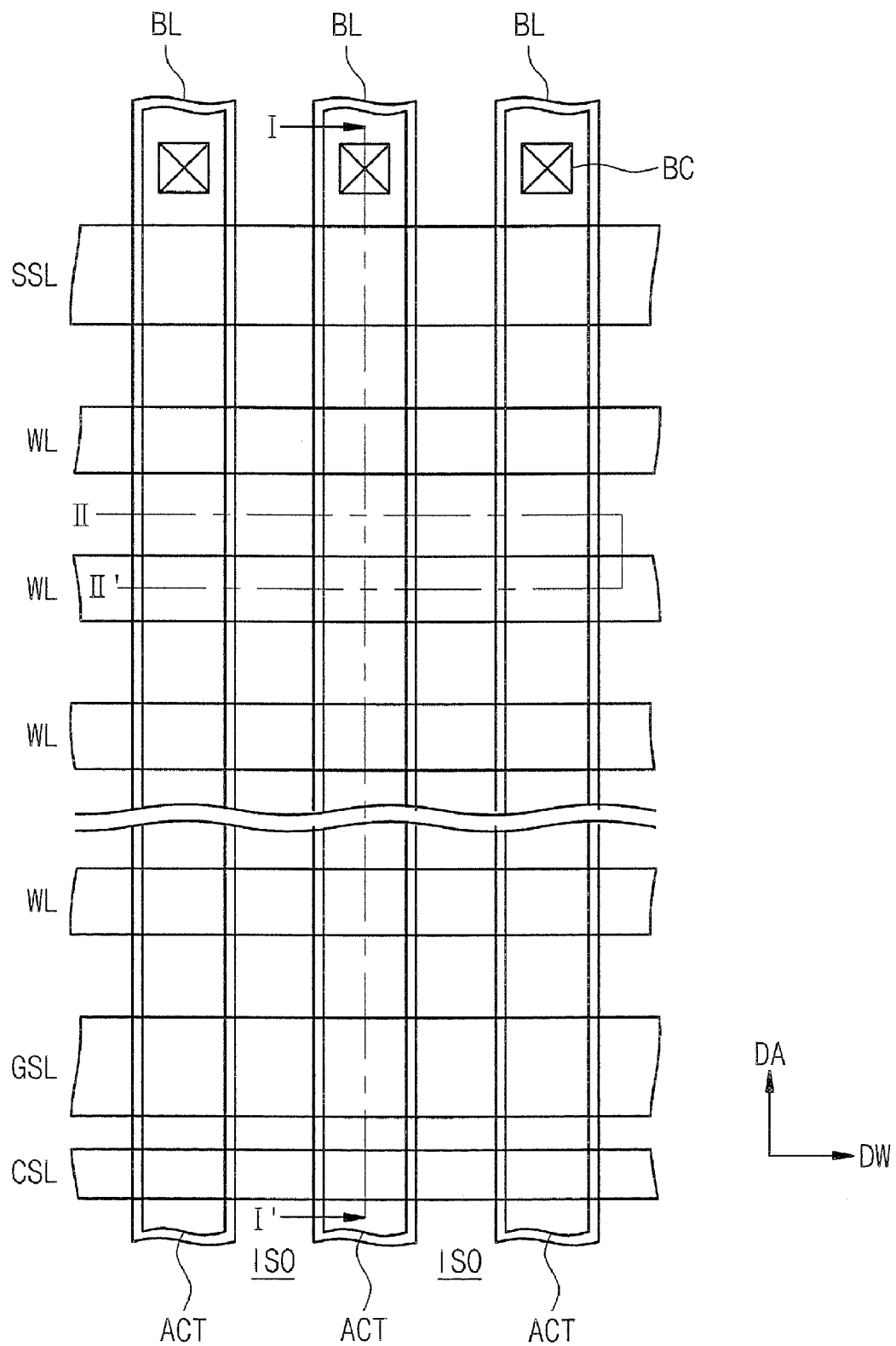
FIG. 1 is a plan view of a non-volatile memory device according to some embodiments of the present invention.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 2A:
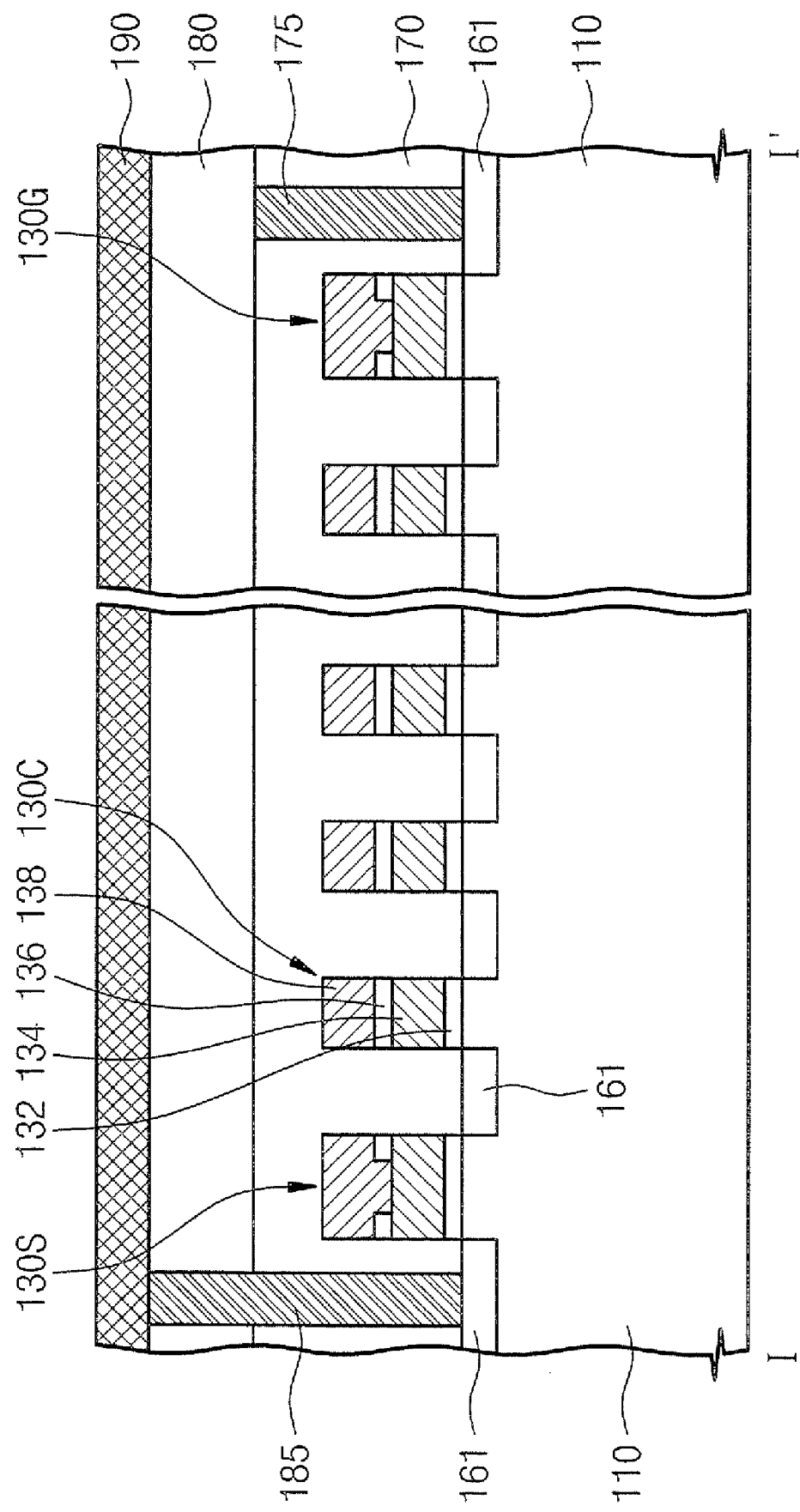
FIG. 2A is sectional view taken along a line I-I' of FIG. 1
Figure 2B:
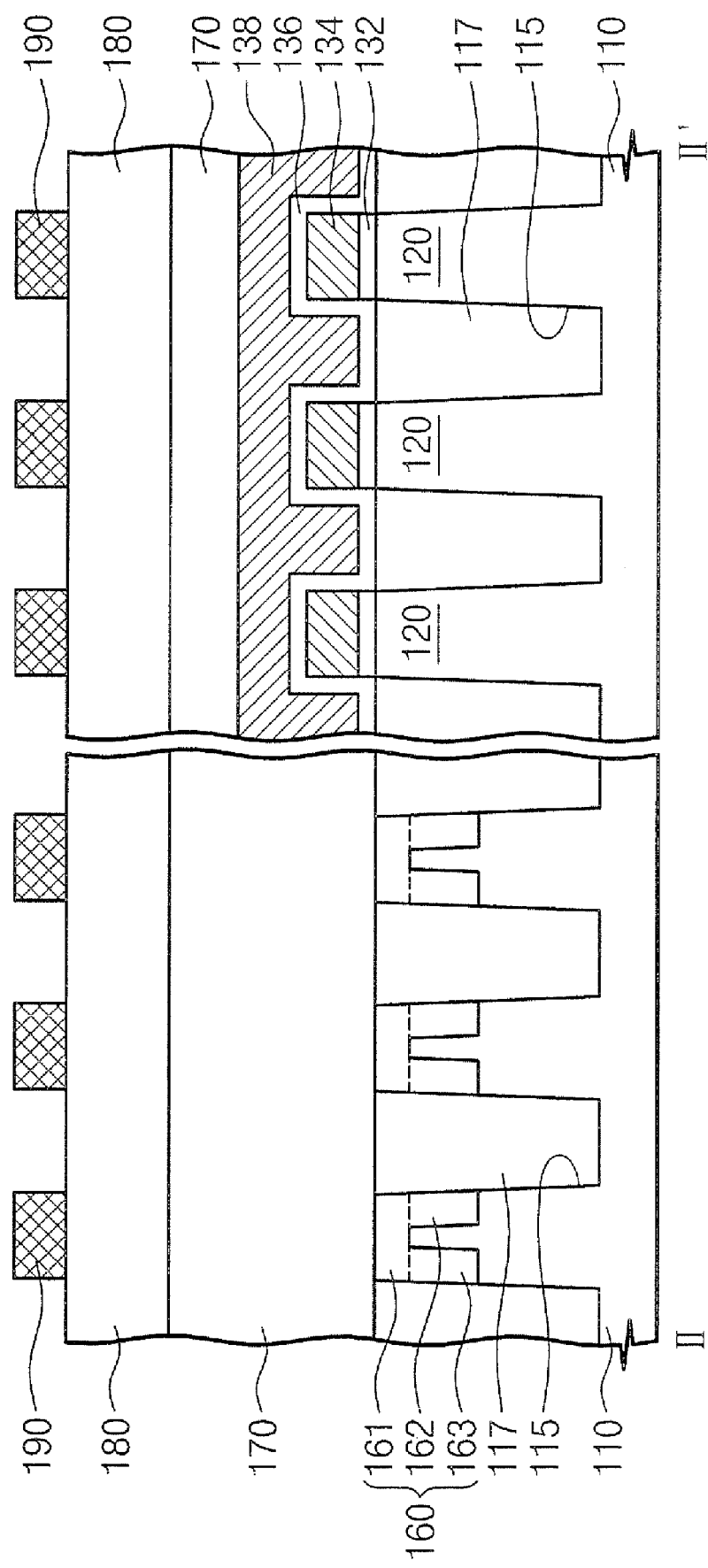
FIG. 2B is sectional view taken along a line II-II' of FIG. 1, for illustrating a non-volatile memory device according to a some embodiments of the present invention.

Referring to FIGS. 1, 2A, and 2B, a non-volatile memory device according to some embodiments of the present invention will be described. The non-volatile memory device includes a semiconductor substrate 110 that has an active region 120 defined by a device isolation layer 117. The active region 120 may protrude from the substrate 110 in a fin-shape, and may extend in a first direction DA. The top surface of the device isolation layer 117 may have substantially the same height as the top surface of the active region 120.

A cell gate structure 130C, a string select gate structure 130S, and a ground select gate structure 130G, which extend in a second direction DW perpendicular to the first direction DA, are disposed on the device isolation layer 117 and the active region 120. The gate structures 130C, 130S, and 130G include a first insulation layer pattern 132, a conductive pattern 134, a second insulation layer pattern 136, and a conductive line 138. The conductive pattern 134 may be disposed as an "island" formed on the active region 120, and the conductive line 138 extends in the second direction DW. The first insulation layer pattern 132, the conductive pattern 134, the second insulation layer pattern 136, and the conductive line 138 of the cell gate structure 130C may be a gate insulation layer, a floating gate, an intergate insulation layer, and a control gate line (or, a word line WL), respectively. The second insulation layer pattern 136 may be partially or entirely removed in the string and ground select gate structures 130S and 130G in some embodiments, such that the conductive pattern 134 and the conductive line 138 can be electrically connected to each other. The conductive lines 138 in the string and ground select gate structures 130S and 130G may be a string select line SSL and a ground select line GSL, respectively.

Source/drain regions 160 are disposed in the active regions at both sides of the gate structures 130C, 130S, and 130G. The source/drain regions 160 together with the cell gate structure 130C, the string select gate structure 130S, and the ground select gate structure 130G may constitute a memory cell transistor, a string select transistor, and a ground select transistor, respectively.

The source/drain region 160 may include a first impurity region 161 in the active region 120, and second impurity regions 162 and 163 at both sides of the active region 120 below the first impurity region 161. The source/drain region 160 may have an inverted-"U" shaped cross section. The second impurity regions 162 and 163 may be electrically connected to each other to constitute one impurity region. A doping concentration of the first impurity region 161 may be higher than those of the second impurity regions 162 and 163. For example, the doping concentration of the first impurity region may be two or more times higher than those of the second impurity regions 162 and 163.

A first interlayer insulation layer 170 is disposed on the semiconductor substrate 110 having the gate structures 130C, 130S, and 130G. A common source line 175 extends through the first interlayer insulation layer 170 and contacts the source/drain region 160 at one side of the ground select gate structure 130G. The common source line 175 extends in the second direction DW and the source/drain regions 160 at one side of the ground select gate structure 130G are electrically connected to each other through the common source line 175.

A second interlayer insulation layer 180 is disposed on the first interlayer insulation layer 170 including the common source line 175. A bit line contact 185 extends through the first and second interlayer insulation layer 170 and 180 and contacts the source/drain region 160 at one side of the string select gate structure 130S. A bit line 190 is disposed on the second interlayer insulation layer 180 and contacts the bit line contact 185. The bit line 190 extends in the first direction DA.

Figure 3A:
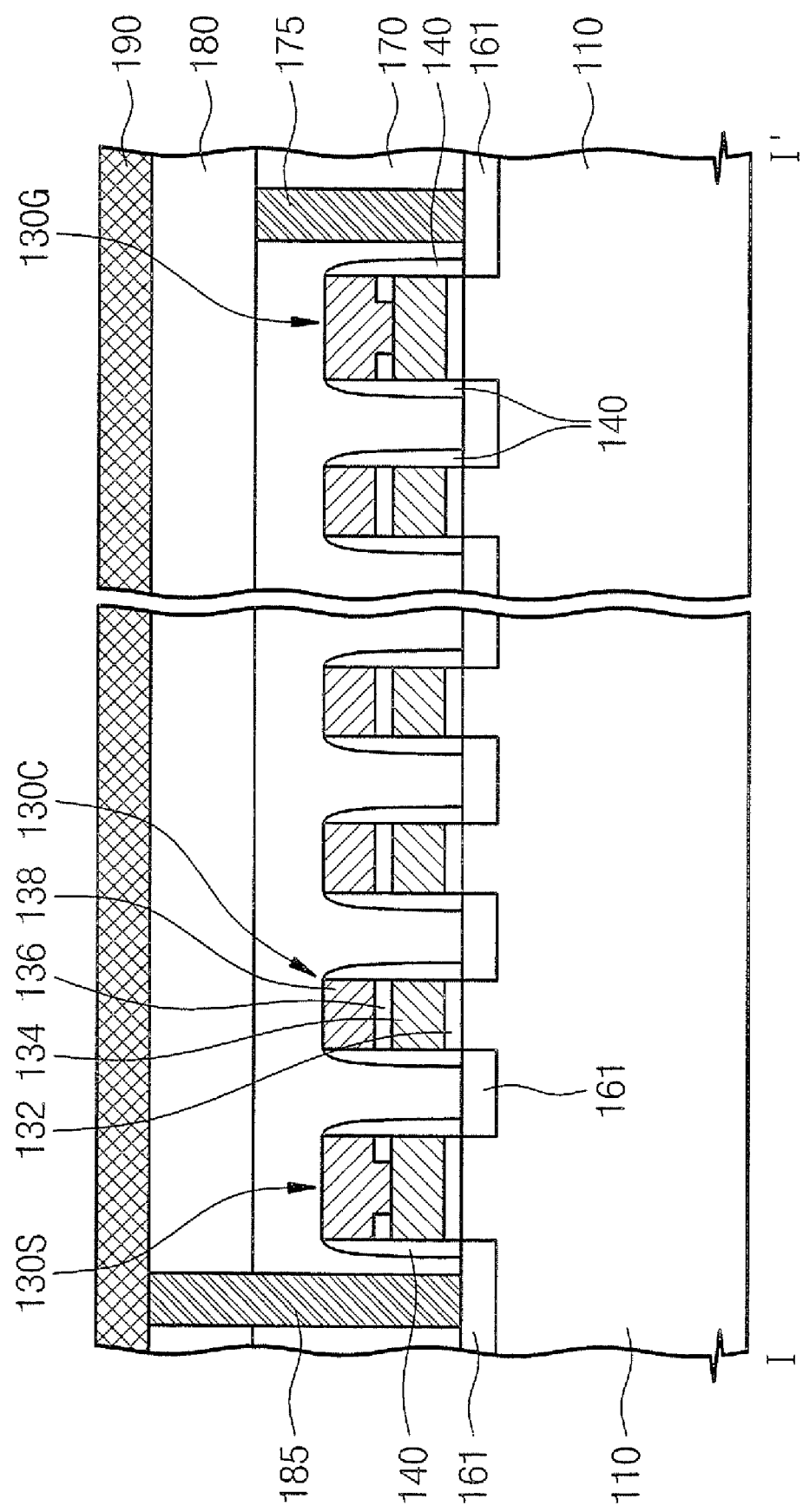
FIG. 3A is sectional view taken along a line I-I' of FIG. 1
Figure 3B:
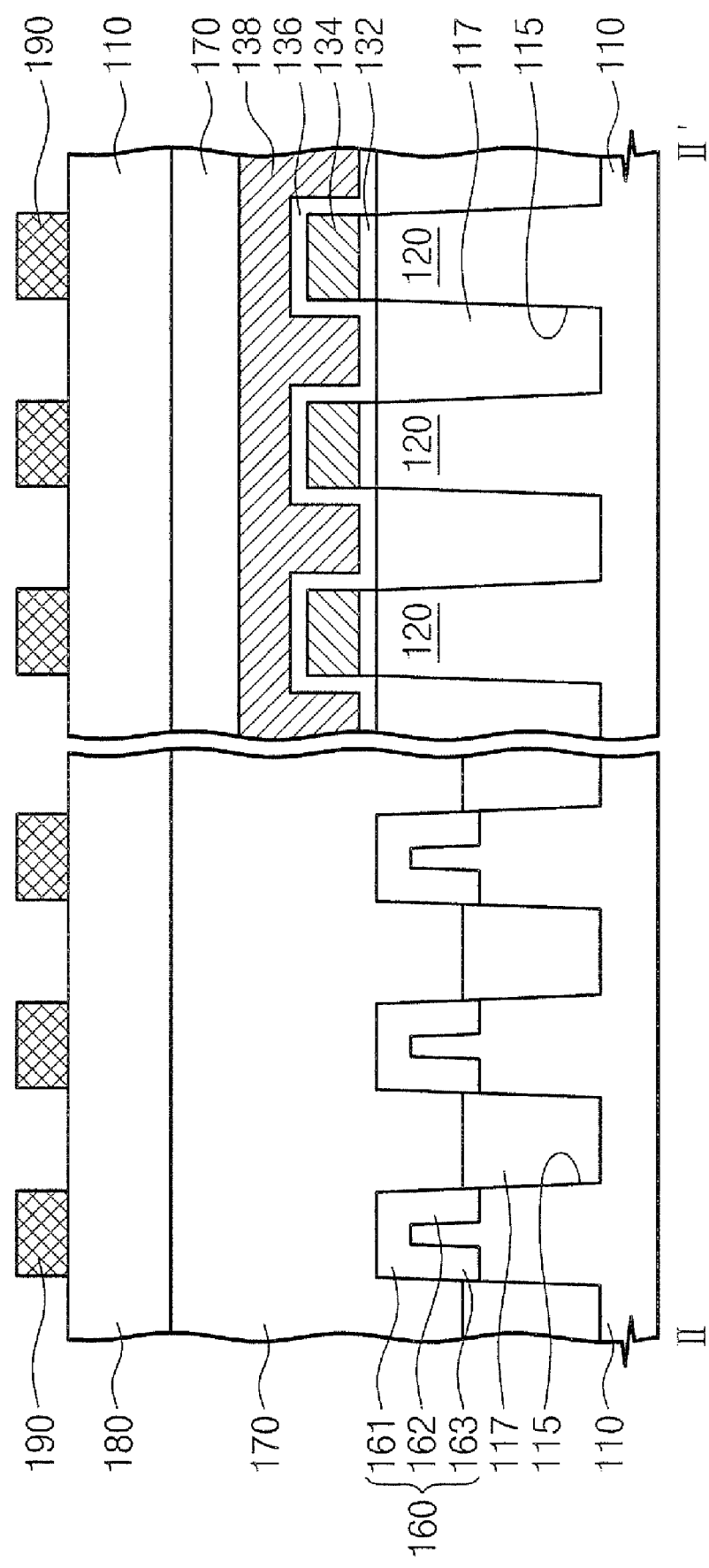
FIG. 3B is sectional view taken along a line II-II' of FIG. 1, for illustrating a non-volatile memory device according to other embodiments of the present invention.

Referring to FIGS. 1, 3A, and 3B, a non-volatile memory device according to other embodiments of the present invention will be described. However, the description of elements similar to that of the above-described embodiment will be omitted for conciseness.

The device isolation layer 117 is partially recessed. That is, the top surface of the device isolation layer 117 below the gate structures 130C, 130S, and 130G may have substantially the same height as the top surface of the active region 120, but the top surface of the device isolation layer 117 at both sides of the gate structures 130C, 130S, and 130G may have the lower height than the top surface of the active region 120. Accordingly, the second impurity regions 162 and 163 at both sides of the active region 120 may be exposed above the recessed device isolation layer 117. Additionally, the first interlayer insulation layer 170 may be filled in a region where the device isolation layer 117 between the exposed active regions 120 is recessed.

A spacer mask 140 is disposed on both sidewalls of the gate structures 130C, 130S, and 130G. The spacer mask 140 is used to recess the device isolation layer 117 as will be described later.

Figure 4B:
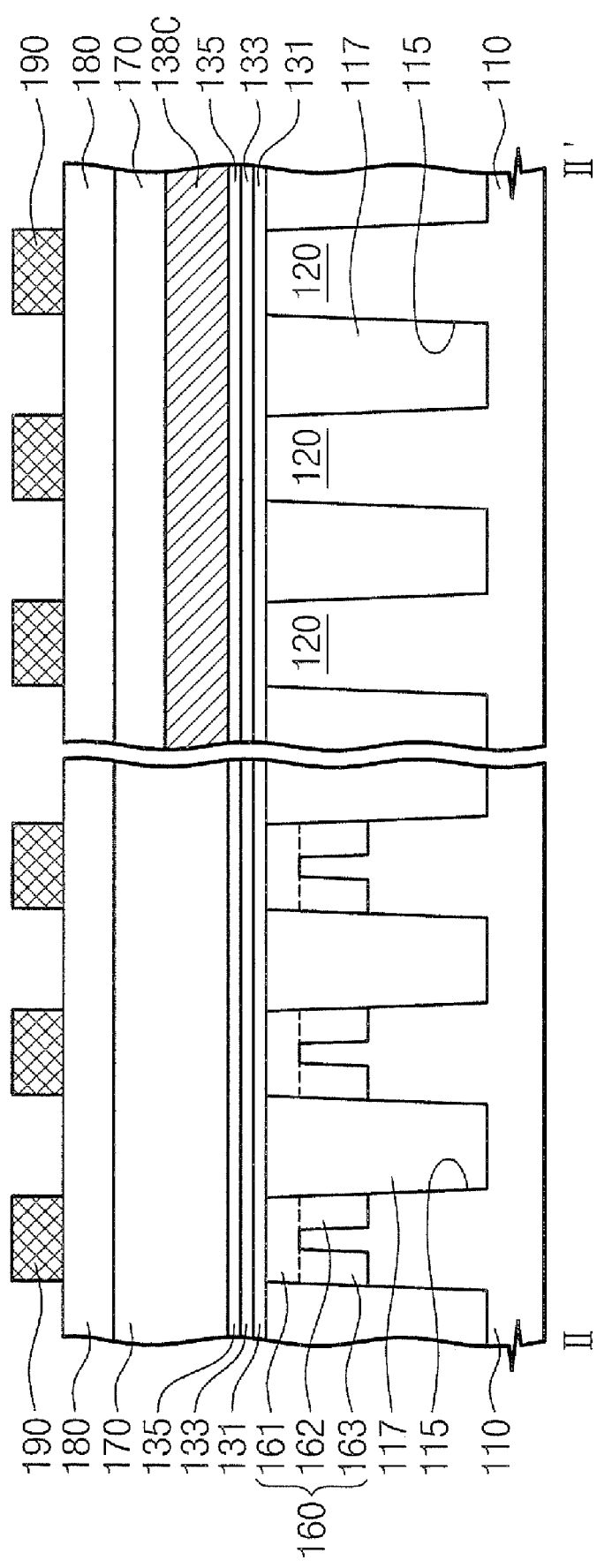
FIG. 4B is sectional view taken along a line II-II' of FIG. 1, for illustrating a non-volatile memory device according to further embodiments of the present invention.

Referring to FIGS. 1, 4A, and 4B, a non-volatile memory device according to further embodiments of the present invention will be described. The non-volatile memory device includes a semiconductor substrate 110 that has an active region 120 defined by a device isolation layer 117. The top surface of the device isolation layer 117 may have substantially the same height as the top surface of the active region 120.

A first insulation layer 131, a charge storage insulation layer 133, a second insulation layer 135 are sequentially disposed on the semiconductor substrate 110 having the device isolation layer 117 and the active region 120. The first insulation layer 131 and the second insulation layer 135 may be a tunneling insulation layer and a blocking insulation layer, respectively. Permittivity of the second insulation layer 135 may be higher than that of the first insulation layer 131. For example, the first insulation layer 131 may be a silicon thermal oxide layer, and the second insulation layer 135 may be a high-k dielectric including aluminum oxide, oxide hafnium, hafnium aluminate, hafnium silicate, hafnium silicon oxynitride, oxide zirconium, zirconium silicate, and zirconium silicon oxynitride. Additionally, the second insulation layer 135 may further include a barrier layer, such as a silicon oxide layer, to prevent a leakage current above and/or below the high-k dielectric. Likewise, in relation to the second insulation layer 135 including the high-k dielectric, embodiments of the present invention may include structures disclosed in U.S. Patent Application Publication No. 2004/0169238, the disclosure of which is incorporated by reference herein. In some embodiments, the layers 131, 133, and/or 135 may extend on the substrate 110 in both directions DA and DW.

A control gate line 138C (or, a word line), a string select gate line 138S, a ground select gate line 138G, which extend in the second direction DW, are disposed on the second insulation layer 135. The gate lines 138C, 138S, and 138G may include polysilicon and/or metal. For example, the control gate line 138C may include a metal having a higher work function than polysilicon. Additionally, the control gate line 138C may include a stack structure of a metal layer having a higher work function than polysilicon and a polysilicon layer. Additionally, a work function of the metal may be higher than about 4 eV. Accordingly, tunneling of charges from the control gate line 138C to the charge storage insulation layer 133 can be reduced. In relation to the control gate line 138C of a metal having a higher work function than polysilicon, embodiments of the present invention may include structures disclosed in U.S. Patent Application Publication No. 2006/0180851, the disclosure of which is incorporated by reference herein.

The source/drain regions 160 are disposed in the active regions at both sides of the gate lines 138C, 138S, and 138G. The source/drain regions 160 together with the control gate line 138C, the string select gate line 138S, and the ground select gate line 138G may constitute a memory cell transistor, a string select transistor, and a ground select transistor, respectively.

The source/drain region 160 may include a first impurity region 161 in the active region 120, and second impurity regions 162 and 163 at both sides of the active region 120 below the first impurity region 161. The source/drain region 160 may have an inverted "U"-shaped cross section. The second impurity regions 162 and 163 may be electrically connected to each other to constitute one impurity region. A doping concentration of the first impurity region 161 may be higher than those of the second impurity regions 162 and 163. For example, the doping concentration of the first impurity region may be two and more times higher than those of the second impurity regions 162 and 163.

A first interlayer insulation layer 170 is disposed on the second insulation layer 135 including the gate lines 138C, 138S, and 138G. A common source line 175 contacts the source/drain region 160 at one side of the ground select gate line 138G through the first interlayer insulation layer 170, the second insulation layer 135, the charge storage insulation layer 133, and the first insulation layer 131. The common source line 175 extends in the second direction DW, and the source/drain regions 160 are electrically connected to each other at one side of the ground select gate line 138G through the common source line 175.

A second interlayer insulation layer 180 is disposed on the first interlayer insulation layer 170 including the common source line 175. A bit line contact 185 contacts the source/drain region 160 at one side of the string select gate line 138S through the first and second interlayer insulation layers 170 and 180. A bit line 190 contacts the bit line contact 185 on the second interlayer insulation layer 180. The bit line 190 extends in the first direction DA.

Figure 5A:
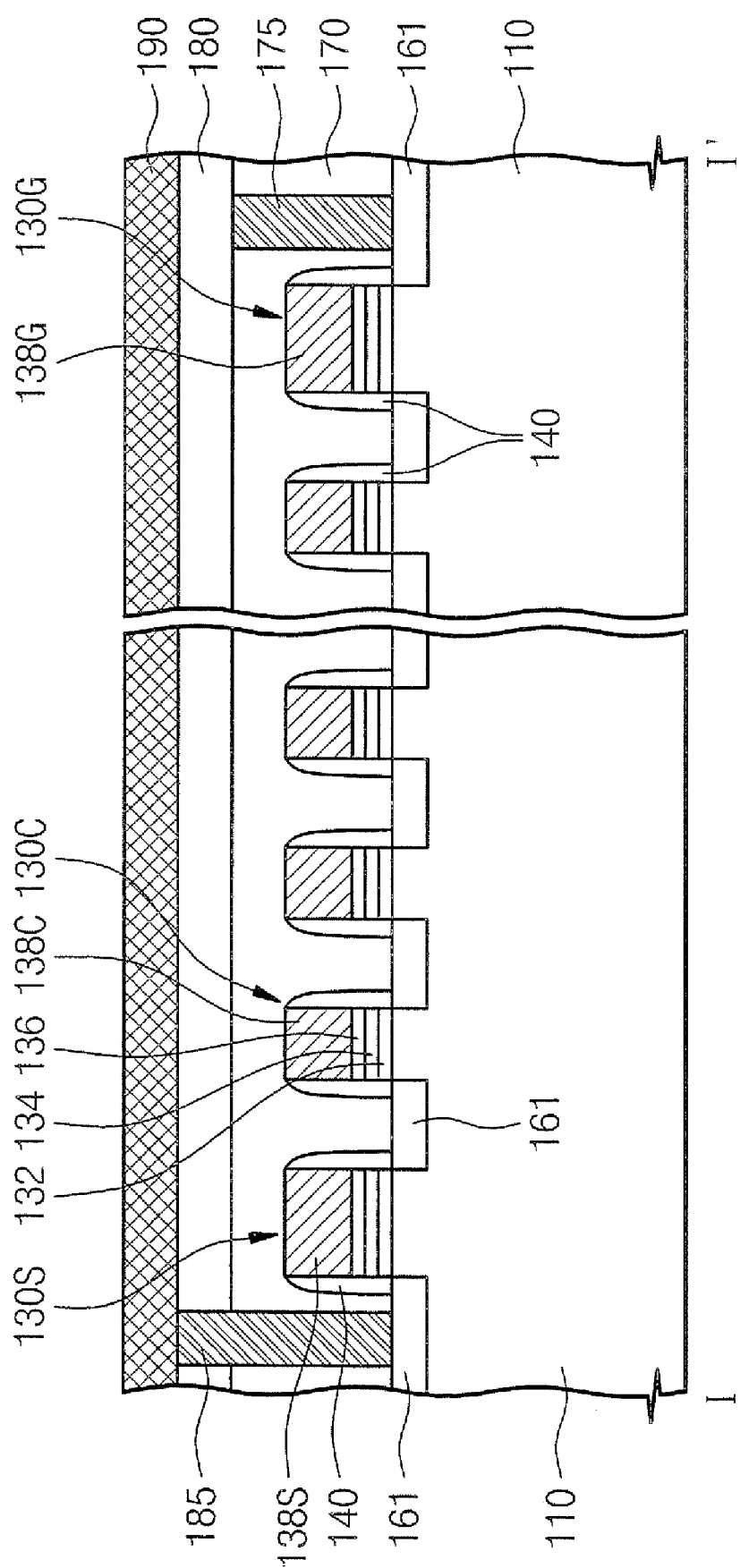
FIG. 5A is sectional view taken along a line I-I' of FIG. 1
Figure 5B:
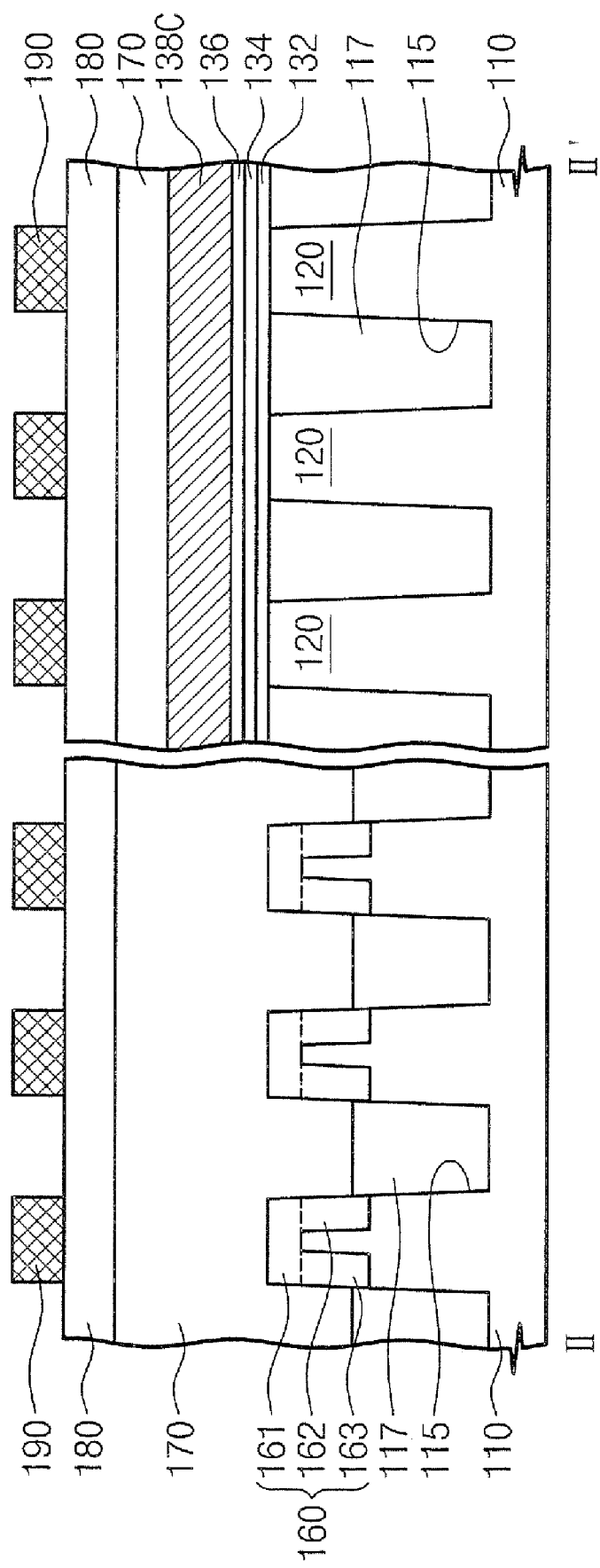
FIG. 5B is sectional view taken along a line II-II' of FIG. 1, for illustrating a non-volatile memory device according to still other embodiments of the present invention.

Referring to FIGS. 1, 5A, and 5B, a non-volatile memory device according to still other embodiments of the present invention will be described. However, the description of elements similar to that of the above-described embodiment will be omitted for conciseness.

A cell gate structure 130C, a string select gate structure 130S, a ground select gate structure 130G, which extend in the second direction DW, are disposed on the device isolation layer 117 and the active region 120. The gate structures 130C, 130S, and 130G may include a first insulation pattern 132, a charge storage insulation layer pattern 134, a second insulation layer pattern 136, and gate lines 138C, 138S, and 138G.

The device isolation layer 117 includes a recessed portion. That is, the top surface of the device isolation layer 117 below the gate structures 130C, 130S, and 130G may have substantially the same height as the top surface of the active region 120, but the top surface of the device isolation layer 117 at both sides of the gate structures 130C, 130S, and 130G may have a lower height than the top surface of the active region 120. Accordingly, the second impurity regions 162 and 163 at both sides of the active region 120 may be exposed above the recessed device isolation layer 117. Additionally, the device isolation layer 117 between the exposed active regions 120 may be filled in the first interlayer insulation layer 170 at the recessed region.

Because the source/drain regions 160 at both sides of the gate structures 130C, 130S, and 130G are not covered by the first insulation layer pattern 132, the charge storage insulation layer pattern 134, and the second insulation layer pattern 136, they are exposed to the external. A spacer mask 140 is disposed at both sidewalls of the gate structures 130C, 130S, and 130G. As will be described later, the spacer mask 140 is used to recess the device isolation layer 117.

Figure 6A:
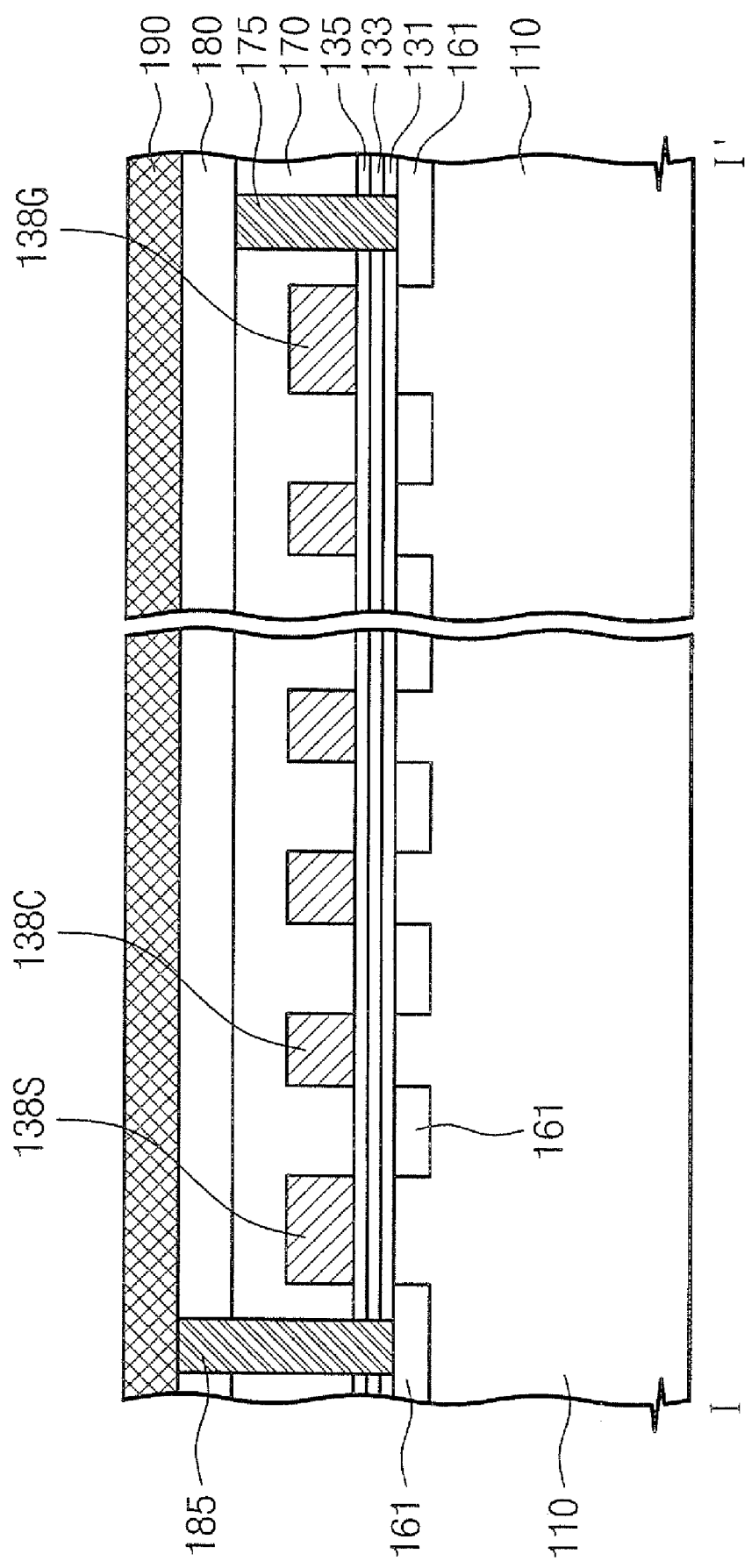
FIG. 6A is sectional view taken along a line I-I' of FIG. 1
Figure 6B:
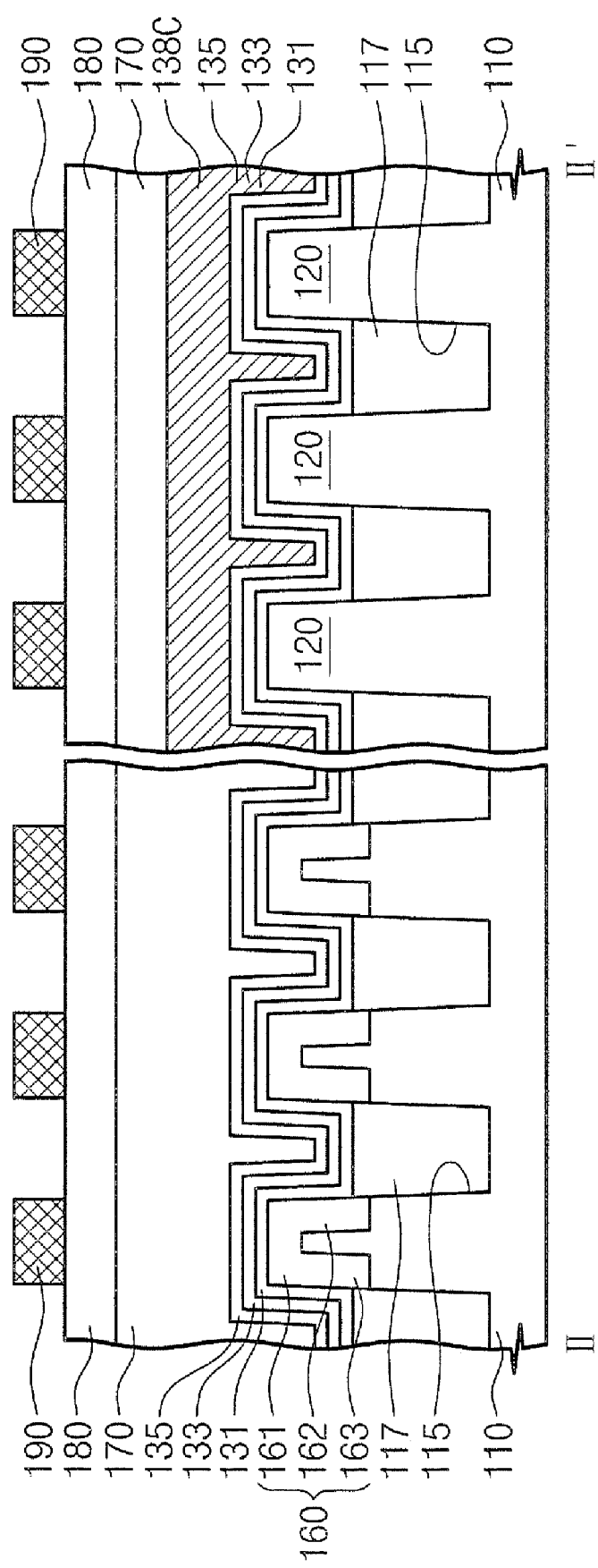
FIG. 6B is sectional view taken along a line II-II' of FIG. 1, for illustrating a non-volatile memory device according to still further embodiments of the present invention.

Referring to FIGS. 1, 6A, and 6B, a non-volatile memory device according to still further embodiments of the present invention will be described. However, the description of elements similar to that of the above-described embodiments will be omitted for conciseness The device isolation layer 117 is entirely recessed to have the lower top surface than the active region 120. The first insulation layer 131, the charge storage insulation layer 133, the second insulation layer 135 have a curved shape along a profile of the active region 120, which protrudes above the device isolation layer 117. In other words, the layers 131, 133, and 135 may conformally extend on the sidewalls and the surface therebetween of the protruding active region.

Also, as described above, the charge storage insulation layer 133 and the second insulation layer 135 may be patterned according to some embodiments.

Figure 7A:
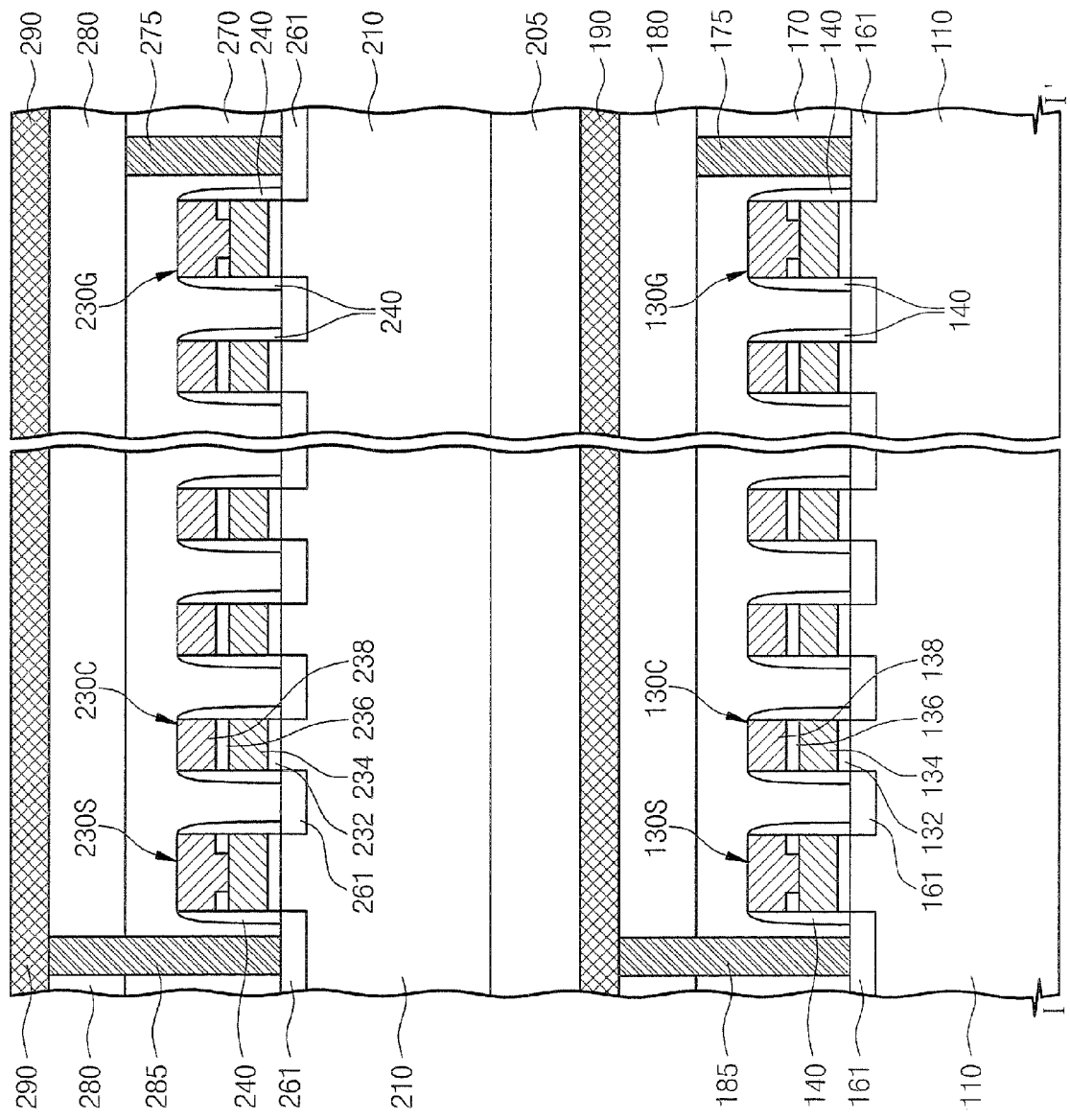
FIG. 7A is sectional view taken along a line I-I' of FIG. 1
Figure 7B:
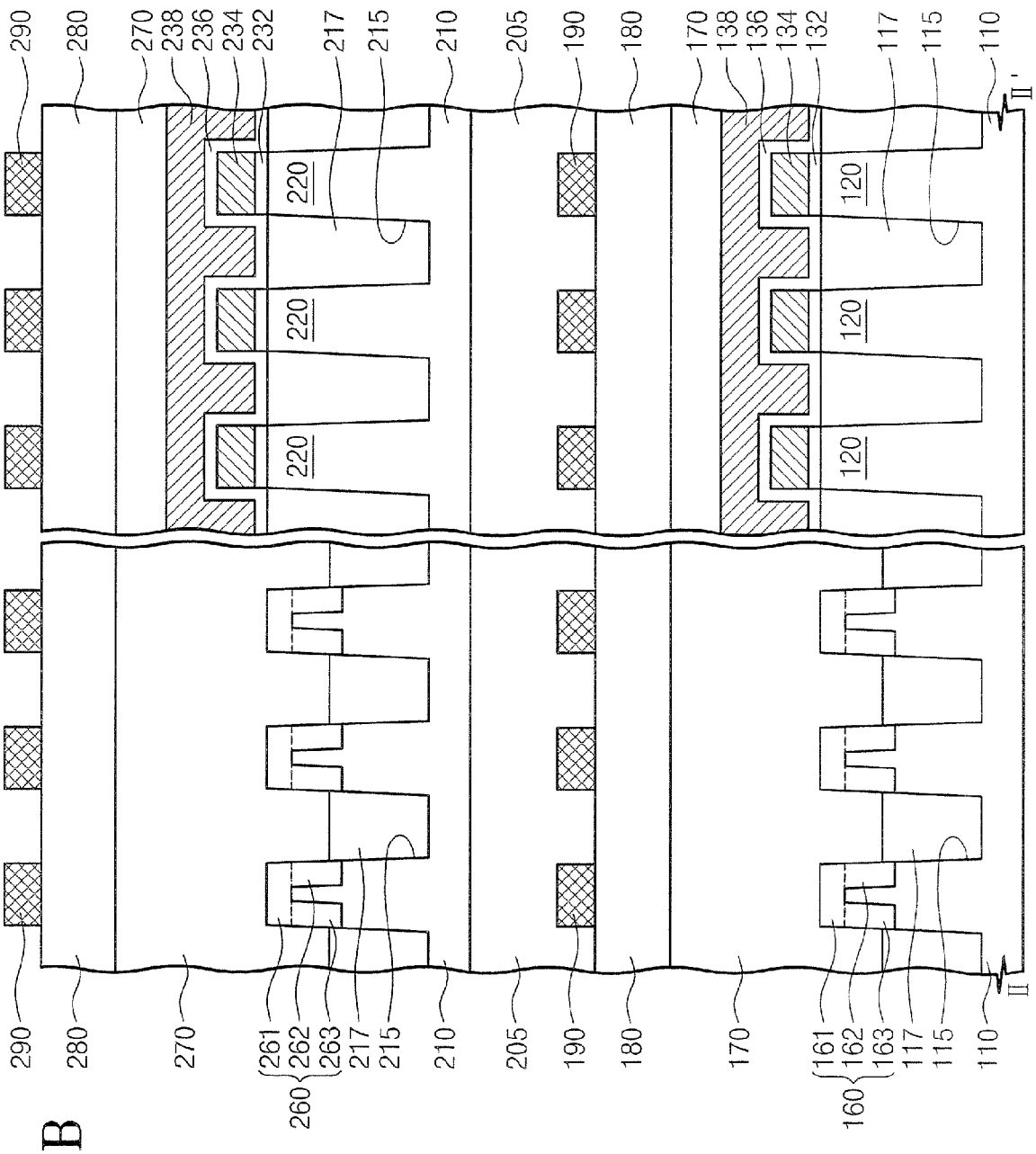
FIG. 7B is sectional view taken along a line II-II' of FIG. 1, for illustrating a non-volatile memory device according to yet other embodiments of the present invention.

Referring to FIGS. 1, 7A, and 7B, a non-volatile memory device according to yet other embodiments of the present invention will be described. However, the description of elements similar to that of the above-described embodiments will be omitted for conciseness.

A third interlayer insulation layer 205 is disposed on the second interlayer insulation layer 180 including the bit line 190. A semiconductor layer is disposed on the third interlayer insulation layer 205 and has an active region 220 defined by a device isolation layer 217. The active region 220 may extend in the first direction DA.

A cell gate structure 230C, a string select gate structure 230S, and a ground select gate structure 230G, which extend in the second direction DW, are disposed on the device isolation layer 217 and the active region 220. That is, the top surface of the device isolation layer 217 below the gate structures 230C, 230S, and 230G may have substantially the same height as the top surface of the active region 220, but the top surface of the device isolation layer 217 at both sides of the gate structures 230C, 230S, and 230G may have a lower height than the top surface of the active region 220. Accordingly, the second impurity regions 262 and 263 at both sides of the active region 220 may be exposed above the recessed device isolation layer 217. A spacer mask 240 is disposed on both sidewalls of the gate structures 230C, 230S, and 230G. The spacer mask 240 is used to recess the device isolation layer 217.

The gate structures 230C, 230S, and 230G may include a first insulation pattern 232, a conductive pattern 234, a second insulation layer pattern 236, and a conductive line 238. The conductive pattern 234 is disposed as an "island" on the top surface of the active region 220, and the conductive line 238 extends in the second direction DW. The first insulation layer pattern 232, the conductive pattern 234, the second insulation layer pattern 236, and the conductive line 238 of the cell gate structure 230C may be a gate insulation layer, a floating gate, an intergate insulation layer, and a control gate line (or, a word line WL), respectively. The second insulation layer pattern 236 may be partially or entirely removed in the string and ground select gate structures 230S and 230G, such that the conductive pattern 234 and the conductive line 238 can be electrically connected to each other. The conductive lines 238 in the string and ground select gate structures 230S and 230G may be a string select line SSL and a ground select line GSL, respectively.

Source/drain regions 260 are disposed in the active regions at both sides of the gate structures 230C, 230S, and 230G. The source/drain regions 260 together with the cell gate structure 230C, the string select gate structure 230S, and the ground select gate structure 230G may constitute a memory cell transistor, a string select transistor, and a ground select transistor, respectively.

The source/drain region 260 may include a third impurity region 261 in the active region 220, and fourth impurity regions 262 and 263 at both sides of the active region 220 below the third impurity region 261. The source/drain region 260 may have an inverted-"U" shaped cross section. The fourth impurity regions 262 and 263 may be electrically connected to each other to constitute one impurity region. A doping concentration of the third impurity region 261 may be higher than those of the fourth impurity regions 262 and 263. For example, the doping concentration of the third impurity region 261 may be two or more times higher than those of the fourth impurity regions 262 and 263.

A fourth interlayer insulation layer 270 is disposed on a substrate 210 including the gate structures 230C, 230S, and 230G. The fourth interlayer insulation layer 270 may be filled in a region where the device isolation layer 217 between the exposed active regions 220 is recessed. A common source line 275 penetrates through the fourth interlayer insulation layer 270 and contacts the source/drain region 260 at one side of the ground select gate structure 230G. The common source line 275 extends in the second direction DW and the source/drain regions 260 at one side of the ground select gate structure 230G are electrically connected to each other through the common source line 275.

A fifth interlayer insulation layer 280 is disposed on the fourth interlayer insulation layer 270 including the common source line 275. A bit line contact 285 penetrates through the fourth and fifth interlayer insulation layer 270 and 280 and contacts the source/drain region 260 at one side of the string select gate structure 230S. A bit line 290 is disposed on the fifth interlayer insulation layer 280 and contacts the bit line contact 285. The bit line 290 extends in the first direction DA.

Figure 8A:
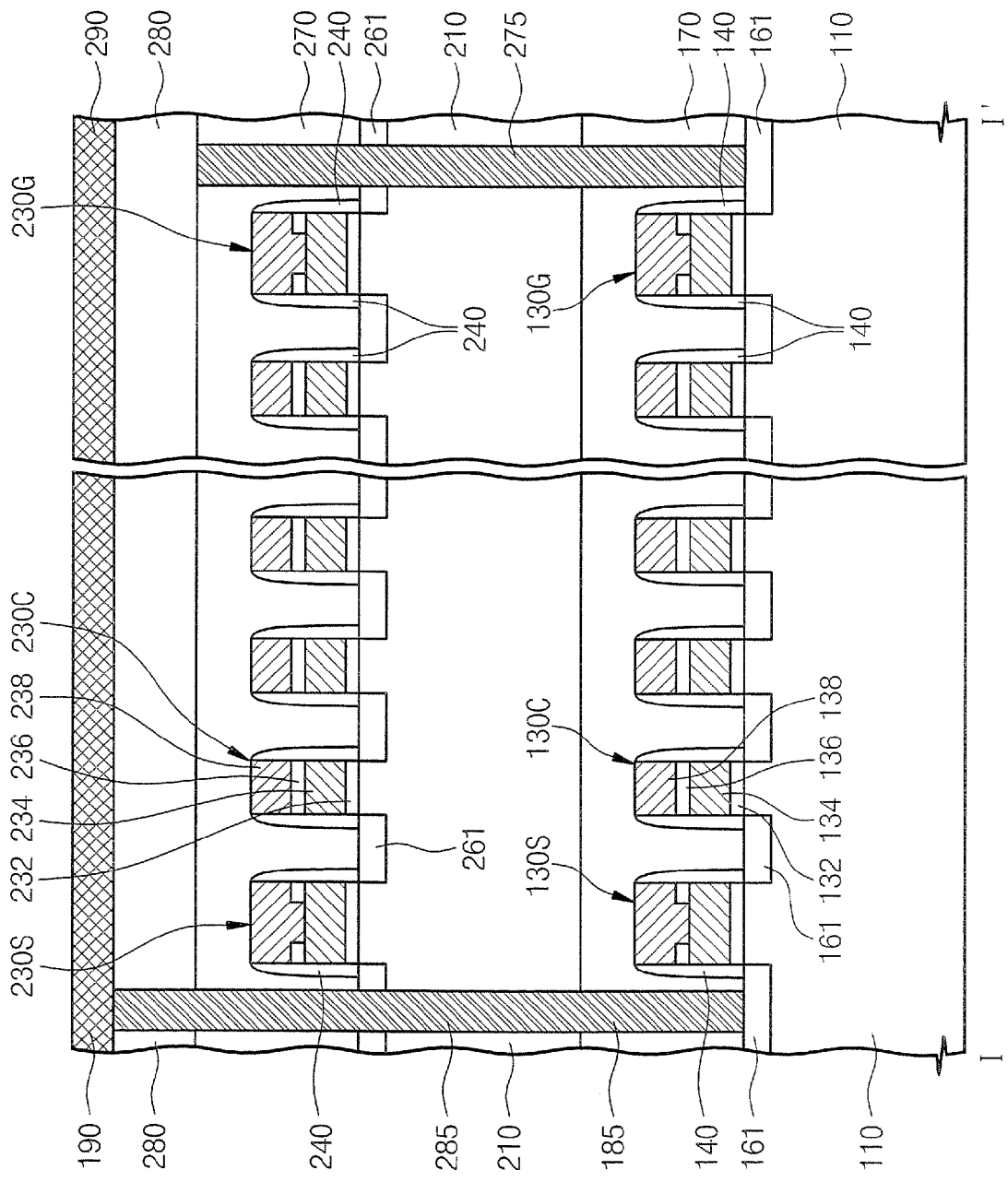
FIG. 8A is sectional view taken along a line I-I' of FIG. 1
Figure 8B:
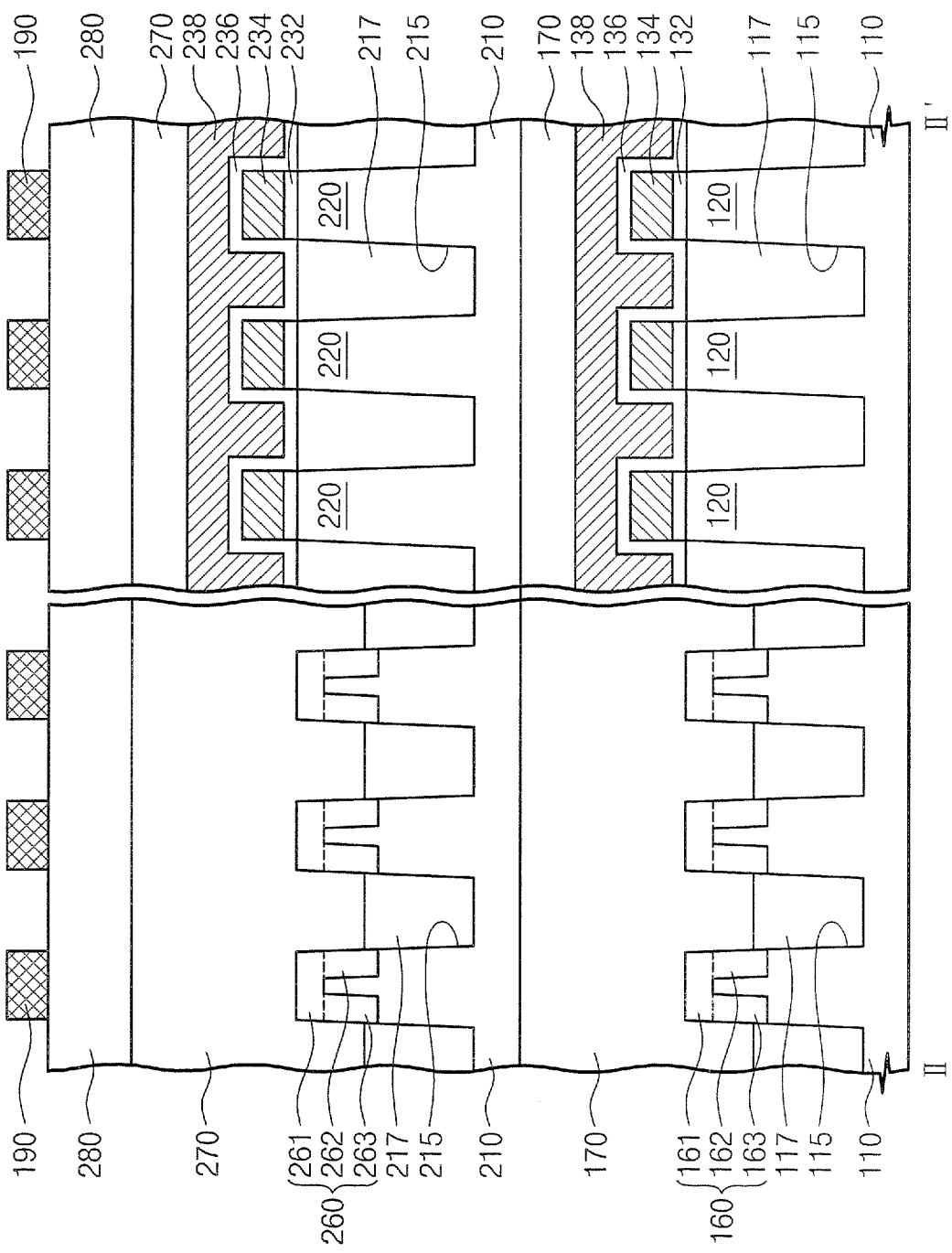

Referring to FIGS. 1, 8A, and 8B, a non-volatile memory device according to yet further embodiments of the present invention will be described. However, the description of elements similar to that of the above-described embodiments will be omitted for conciseness.

The first interlayer insulation layer 170 is disposed on the semiconductor substrate 110 including the gate structures 130C, 130S, and 130G, and the semiconductor layer 210 is disposed on the first interlayer insulation layer 170. The second interlayer insulation layer 270 is disposed on the semiconductor layer 210 including the gate structures 230C, 230S, and 230G.

The common source line 275 extends through the second interlayer insulation layer 270, the semiconductor layer 210, and the first interlayer insulation layer 170 and contacts the source/drain region 160 and 260 at one side of the ground select gate structure 130G and 230G. The common source line 275 extends in the second direction DW, and the source/drain regions 160 at one side of the ground select gate structure 130G and the source/drain regions 260 at one side of the ground select gate structure 230G are electrically connected to each other through the common source line 275.

The third interlayer insulation layer 280 is disposed on the second interlayer insulation layer 270 including the common source line 275. The bit line contact 285 extends through the third interlayer insulation layer 280, the second interlayer insulation layer 270, the semiconductor layer 210, and the first interlayer insulation layer 170 to contact the source/drain region 260 at one side of the string select gate structure 230S and the source/drain region 160 at one side of the string select gate structure 130S. The bit line 290 is disposed on the third interlayer insulation layer 280 to contact the bit line contact 285. The bit line 290 extends in the first direction DA.

A memory cell operation of the above-described non-volatile memory device is described as follows.

First, with regard to a program operation, a voltage of about 0 V is applied to a bit-line connected to a selected memory cell transistor, and a program voltage Vpgm is applied to a word line connected to the selected memory cell transistor. Accordingly, a high voltage difference occurs between a channel region of the memory cell transistor and a control gate line. Electrons in the channel region are implanted into a charge storage layer through Fowler-Nordheim tunneling caused by the voltage difference. At this point, a pass voltage Vpass is applied to the word line connected to the non-selected memory cell transistor. A threshold voltage of the selected memory cell transistor changes into a positive voltage through the program operation.

With regard to an erase operation, an erase voltage Verase is applied to a substrate, and a voltage of about 0 V is applied to a word line connected to the selected memory cell transistor. That is, because of an electric field caused by the erase voltage Verase in a direction opposite to that of the program operation, electrons trapped in the charge storage layer are erased and also holes are implanted. Due to the erase operation, a threshold voltage of the memory cell transistor changes into a positive voltage, i.e., about −3 V.

When electrons are stored in the memory cell transistor, a read operation has a positive threshold voltage, and when holes are stored in the memory cell transistor, the read operation has a negative threshold voltage. That is, when a voltage of about 0 V is applied to the selected word line, data 0 or 1 can be read according to whether a current path is formed at the selected memory cell transistor.

The program operation is performed after performing the erase operation on all the memory cell transistors. Non-selected memory cell transistors should be prevented from being programmed in order to avoid program disturbance in the non-selected memory cell transistors connected to the non-selected bit lines among the memory cell transistors connected to the selected word line.

For example, when programming the selected memory cell transistors, a voltage of about 0V is applied to the ground select line (or, the gate of the ground select transistor) to cut off a ground path of the memory cell array. A voltage of about 0 V is applied to the selected bit line, and a program inhibit voltage is applied to the non-selected bit line. At this point, a power voltage Vcc is applied as a program inhibit voltage. Simultaneously, the power voltage Vcc is applied to the string select line (or, the gate of the string select transistor) to allow a source of the string select transistor to charge up to a predetermined voltage (e.g., the power voltage−the threshold voltage of the string select transistor Vcc−Vth), and the channel of the memory cell in the program inhibited string to be in a floating state. Next, a program voltage Vpgm is applied to the selected word line, and a pass voltage Vpass is applied to the non-selected word lines, such that the channel region of the memory cell transistors connected to the same string is boosted with a predetermined voltage through charge sharing. That is, by applying the pass voltage Vpass to the non-selected word line, a voltage difference is reduced between a gate and a channel of a non-selected memory cell transistor that requires program inhibition. Therefore, the program inhibition can be accomplished. Here, a channel voltage Vchannel determined by the program voltage Vpgm and the pass voltage Vpass can be expressed in the following Equation 1.

$$Vchannel = [Vpgm + (N-1)Vpass] \times \frac{1}{N} \times \frac{Cona}{Cona + Cchannel} \quad \text{[Equation 1]}$$

where Cchannel represents a depletion capacitance caused by a depletion region below a channel, Cona represents a capacitance between a control gate and a channel, and N represents the number of word lines in one string.

Referring to the above Equation 1, the pass voltage may play an important role to increase the channel voltage Vchannel. However, the role may work only if the floated channels are electrically connected to each other through the source/drain regions. Because the area of the source/drain region may be decreased due to increased integration in memory devices, a depletion layer of a channel may expand as an electric field of the channel increases. Thus, the depletion layer of the source/drain region may also expand. If the channels are not be connected to each other through the source/drain region, the channel of the memory cell transistor connected to a word line where a program voltage is applied cannot be effectively increased due to the pass voltage Vpass. That is, because the pass voltage Vpass cannot affect the channel of the memory cell transistor that needs to be program-inhibited, an electric potential of a channel cannot be increased even if a pass voltage Vpass is increased. However, according to embodiments of the present invention as illustrated in FIGS. 2A through 8B, because the source/drain region 160 includes the first impurity region 161 and the second impurity regions 162 and 163, even if channels may not be connected to each other by the expansion of a depletion layer at the first impurity region 161, which is affected by the expansion of a depletion layer due to an electric field of a channel, the channels may be connected to each other through the second impurity regions 162 and/or 163 below the first impurity region 161. That is, because an electric potential of a channel of a memory cell transistor that requires program inhibition can be increased, program inhibition can be effectively accomplished.

Referring to FIGS. 1 and 9A through 13B, a method of forming a non-volatile memory device according to some embodiments of the present invention will be described.

Figure 9B:
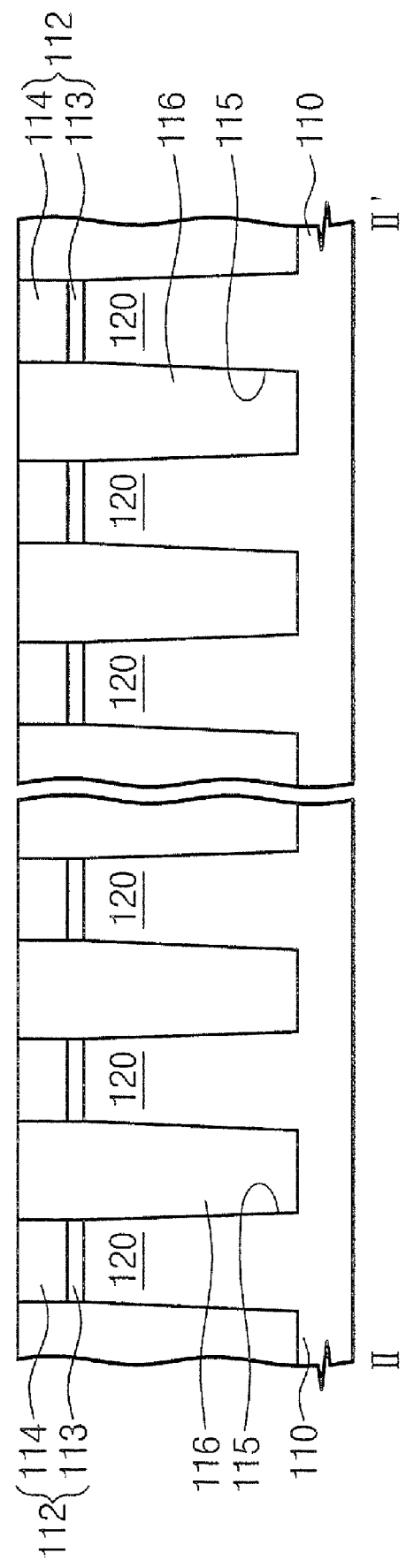

Referring to FIGS. 1, 9A, and 9B, a mask pattern 112 extending in the first direction DA is formed on the semiconductor substrate 110. The mask pattern may include an oxide layer pattern 113 and a nitride layer pattern 114. The semiconductor substrate 110 is etched by using the mask pattern 112 as an etching mask in order to form a trench 115 for device isolation. An active region extending in the first direction DA is defined below the mask pattern 112 by the trench 115 for device isolation. After filling the trench 115 for device isolation with an insulation layer, a planarization process is performed to form the device isolation layer 116.

Figure 10A:
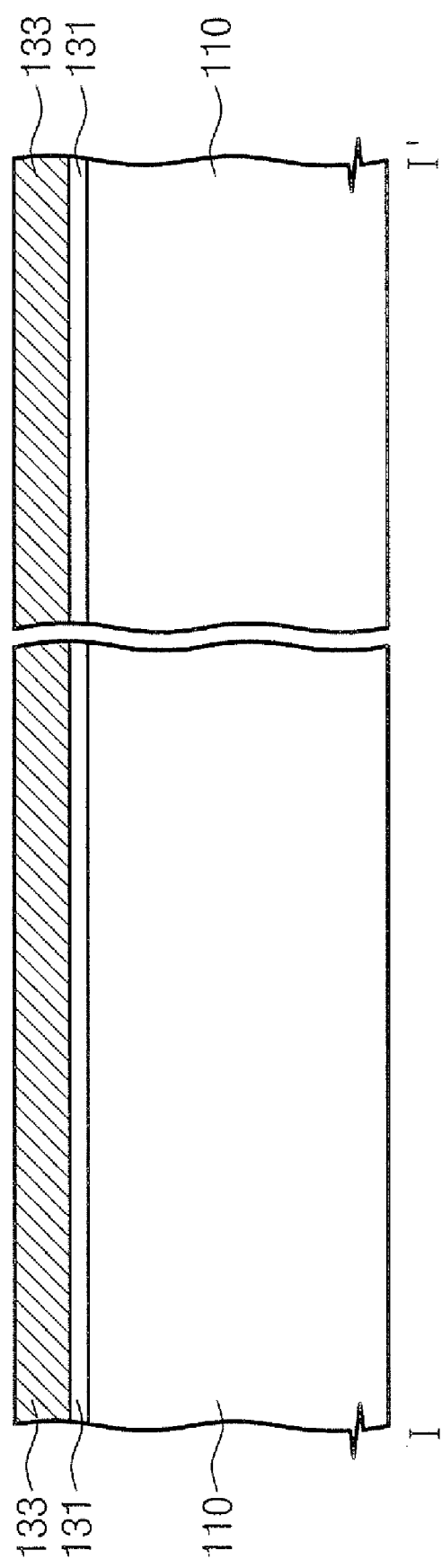
Figure 10B:
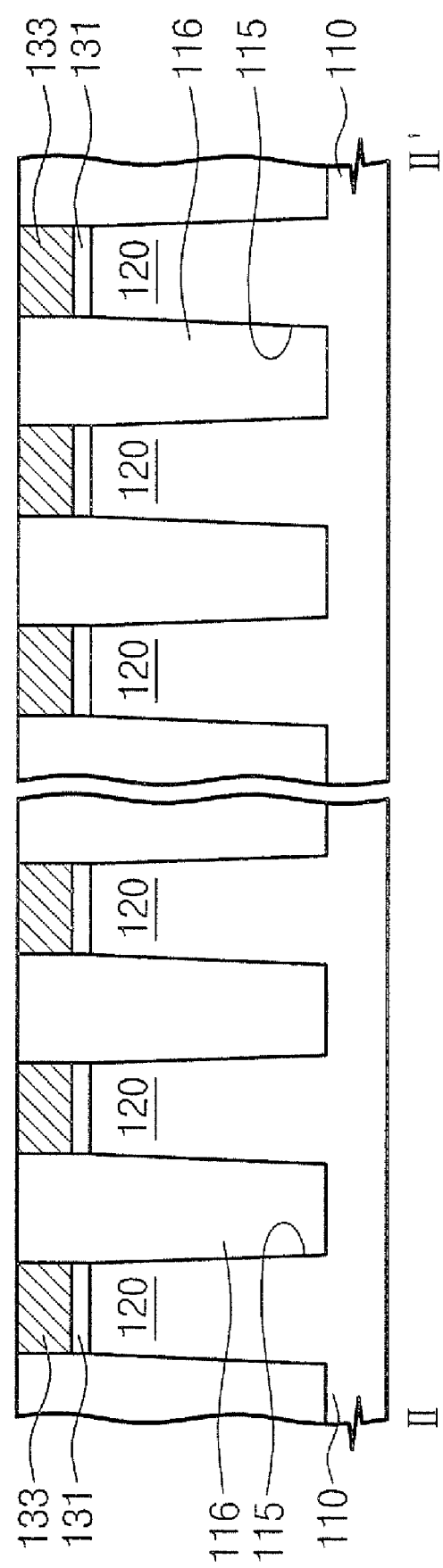

Referring to FIGS. 1, 10A, and 10B, the mask pattern 112 is removed, and thus the active region 120 is exposed. A first insulation layer 131 and a first conductive pattern 133, which extend in the first direction DA, are formed on the exposed active region 120. For example, the first insulation layer 131 may be formed of a silicon oxide through a thermal oxidation process, and the first conductive pattern 133 may be formed of doped poly silicon. According to this embodiment, although the first insulation layer 131 and the first conductive pattern 133 are formed after forming the device isolation layer 116, its formation order can be changed. For example, after forming the first insulation layer 131 and the first conductive pattern 113, the trench 115 for device isolation can be formed by using the first conductive pattern 133 as an etching mask, and then the device isolation layer 116 can be formed to fill the trench 115 for device isolation.

Figure 11A:
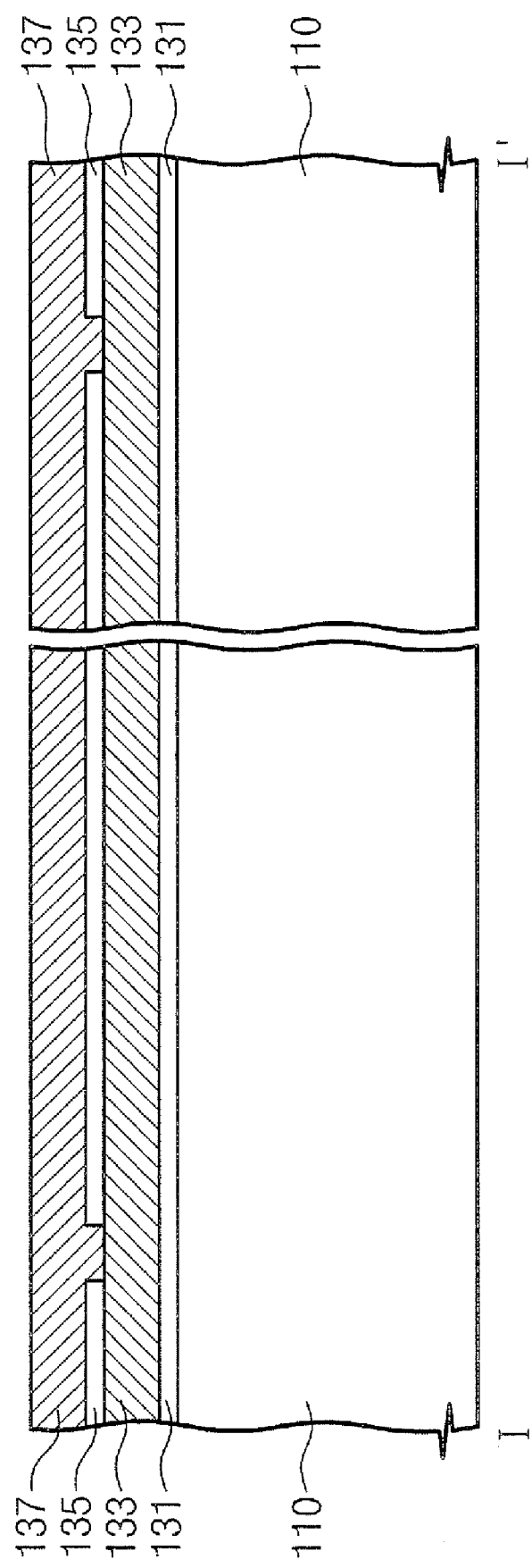
Figure 11B:
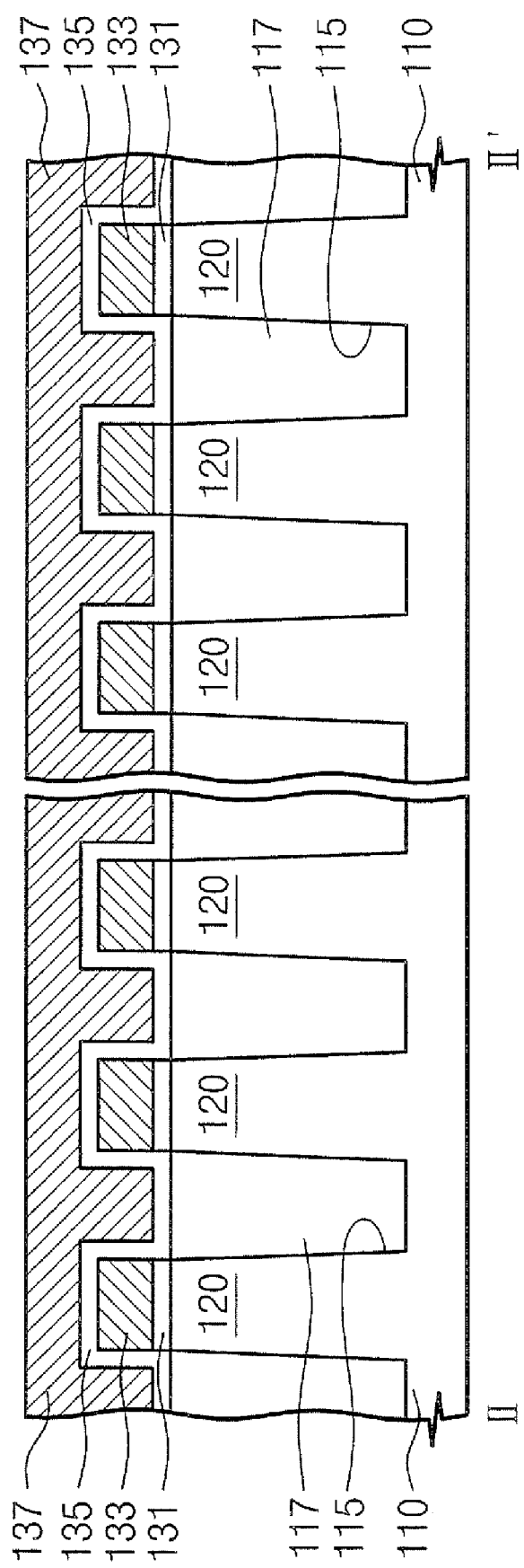

Referring to FIGS. 1, 11A, and 11B, because the device isolation layer 116 is etched, its top surface is lowered. A second insulation layer 135 and a conductive layer 137 are formed on the semiconductor substrate 110 including the device isolation layer 117 with the lowered top surface. Because the second insulation layer is partially removed before forming the conductive layer 137, the first conductive pattern 133 may be exposed. The conductive layer 137 may be electrically connected to the first conductive pattern 133 at a region where the first conductive pattern 133 is exposed. For example, the second insulation layer 135 may be formed of an oxide-nitride-oxide (ONO) layer, and the conductive layer 137 may be formed of a doped polysilicon and/or metal.

Figure 12A:
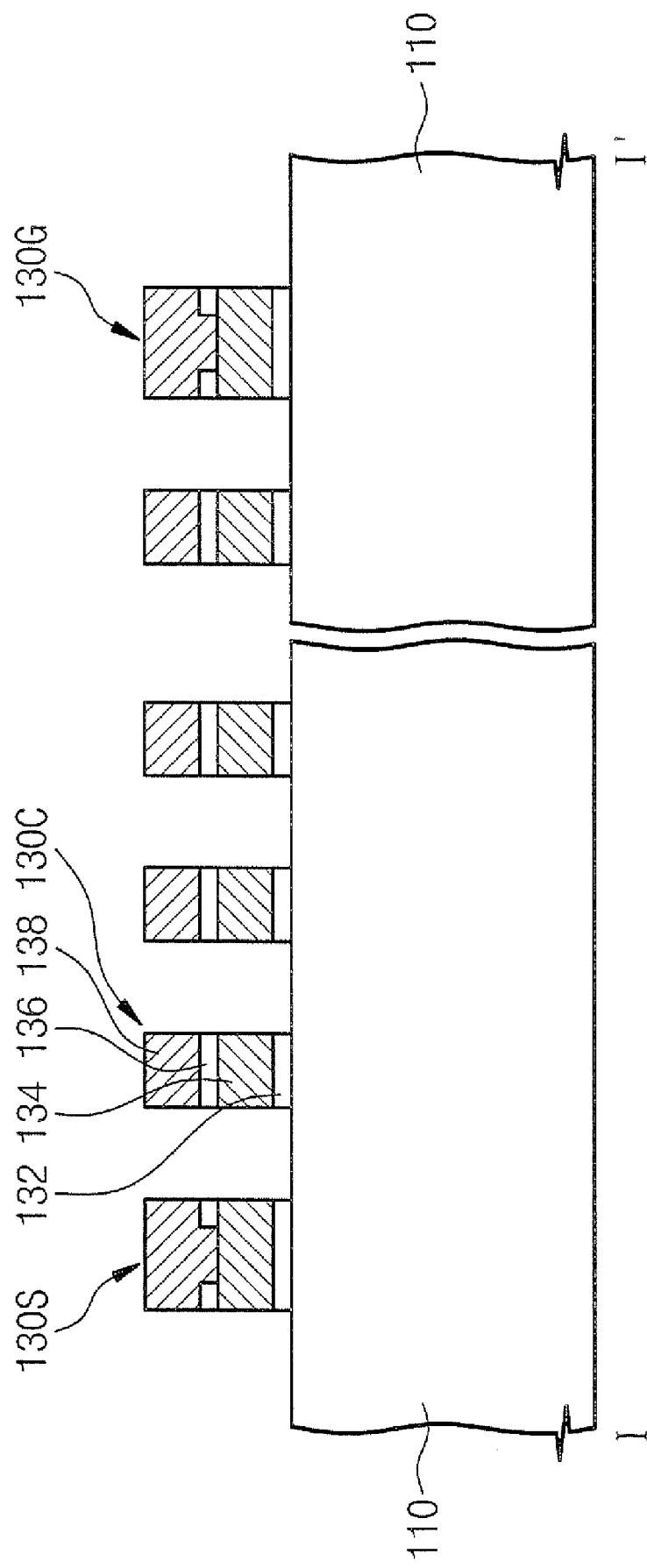
Figure 12B:
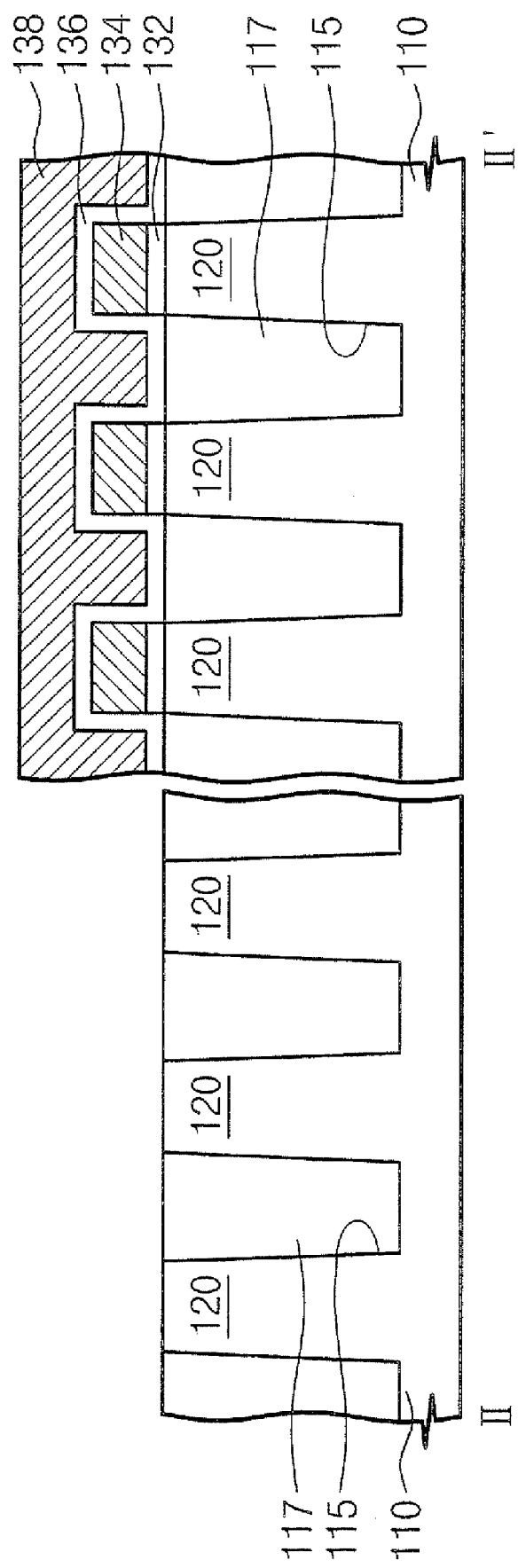

Referring to FIGS. 1, 12A, and 12B, the conductive layer 137, the second insulation layer 135, and the first conductive pattern 133, and the first insulation layer 131 are patterned to form a cell gate structure 130C, a string select gate structure 130S, and ground select gate structure 130G, which all include the conductive line 138, the second insulation layer pattern 136, the second conductive pattern 134, and the first insulation layer pattern 132. In the cell gate structure 130C, the first insulation layer pattern 132, the second conductive pattern 134, the second insulation layer pattern 136, and the conductive line 138 may be a gate insulation layer, a floating gate, an intergate insulation layer, and a control gate, respectively. In the string and ground select gate structures 130S and 130G, the second insulation layer pattern 136 between the second conductive pattern 134 and the conductive line 138 may be partially or entirely removed, and thus the second conductive pattern 134 and the conductive line 138 are electrically connected to each other. The second conductive pattern 134 is arranged as an "island" on the top surface of the active region 120, and the conductive line 138 extends in the second direction DW. The active region 120 and the device isolation layer 117 may be exposed at both sides of the gate structures 130C, 130S, and 130G, and the first insulation layer 131 may remain.

Figure 13A:
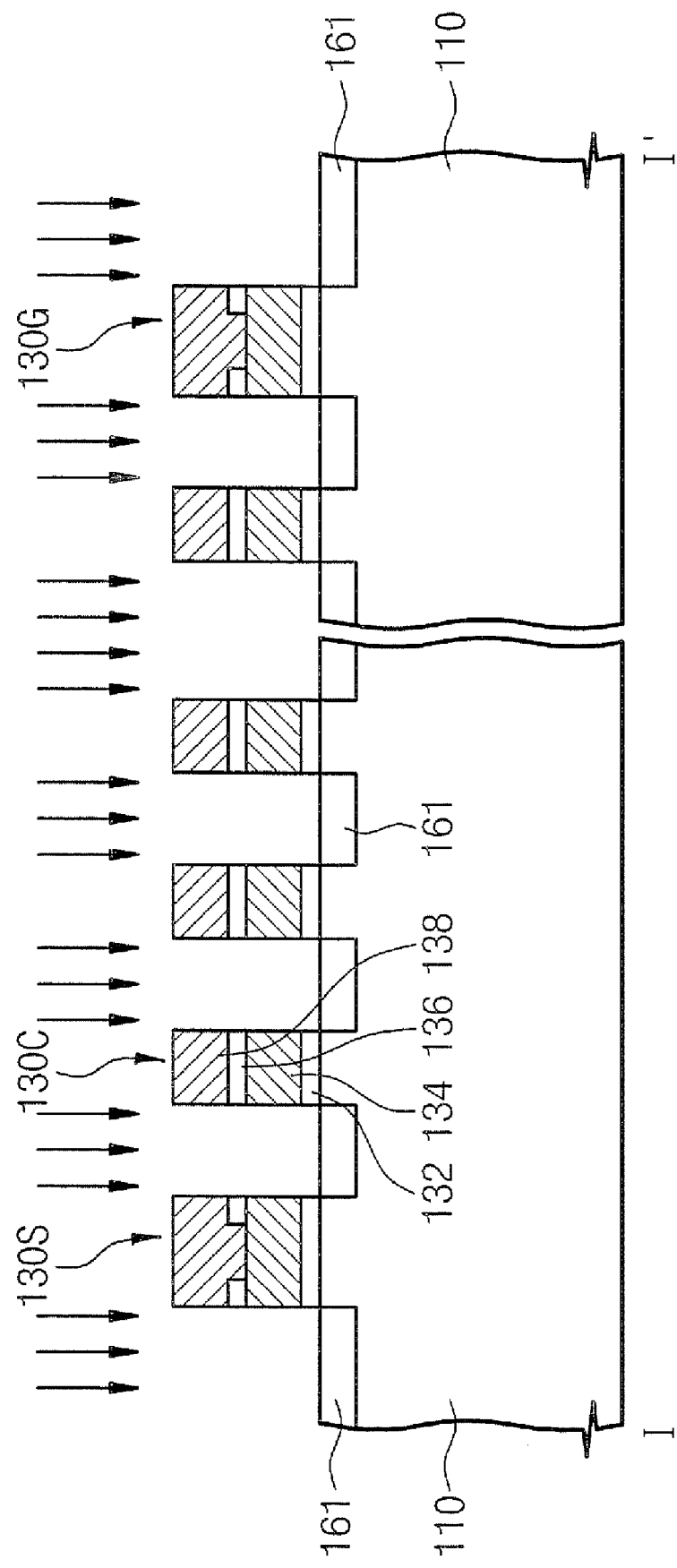

Referring to FIGS. 1, 13A, and 13B, the ion implantation is performed to form the source/drain region 160 in the active regions 120 at both sides of the gate structures 130C, 130S, and 130G. The source/drain region 160 may include a first impurity region 161 in the active region 120, and second impurity regions 162 and 163 at both sides of the active region 120 below the first impurity region 161. The source/drain region 160 may have an inverted-U shaped cross section. However, the second impurity regions 162 and 163 may be electrically connected to each other because impurity ions may be diffused by a subsequent thermal treatment process.

The ion implantation process includes a first ion implantation process and a second ion implantation process. During the first and second ion implantation processes, impurity ions 150 are implanted into the semiconductor substrate 110 in a direction angled toward the second direction DW from a perpendicular direction with respect to the semiconductor substrate 110. That is, the implanted impurity ions 150 have an angle of incidence $\theta$ greater than 0° with reference to a direction perpendicular to the substrate 110. Here, the perpendicular direction to the semiconductor substrate 110 is the reference direction of the angle of incidence $\theta$. When the impurity ions are implanted into the semiconductor substrate 110 in the perpendicular direction, the angle of incidence $\theta$ of the impurity ions is 0°.

The first impurity ions 151 are implanted through the first ion implantation process to form the first impurity region 161 and the second impurity region 162 at one side of the active region 120. Additionally, the second impurity ions 152 are implanted through the second ion implantation process, in order to increase a doping concentration of the first impurity region 161. Therefore, the second impurity region 163 is formed at the other side of the active region 120. To form the stable and uniform source/drain region 160, the first and second impurity ions 151 and 152 may be symmetrically implanted to each other at the same (i.e., equal but opposite) angle of incidence θ.

Because the impurity ions 150 implanted into the second impurity regions 162 and 163 need to penetrate through the device isolation layer 117, implantation energy and ion implantation depth Rp can be appropriately adjusted in order to implant impurity ions 150 into both sides of the active region 120.

Because the first and second impurity ions 151 and 152 are both implanted into the first impurity region 161, a doping concentration of the first impurity region 161 may be greater than that of the second impurity regions 162 and/or 163, where only one of the first and second impurities 151 and 152 is implanted. For example, the doping concentration of the first impurity region 161 may be two or more times higher than the second impurity regions 162 and 163.

Referring again to FIGS. 1, 2A, and 2B, the first interlayer insulation layer 170 is disposed on the semiconductor substrate 110 having the source/drain region 160. The common source line 175 extends through the first interlayer insulation layer 170 and contacts the source/drain region 160 at one side of the ground select gate structure 130G. The common source line 175 extends in the second direction DW and the source/drain regions 160 at one side of the ground select gate structure 130G are electrically connected to each other through the common source line 175. The second interlayer insulation layer 180 is disposed on the first interlayer insulation layer 170 including the common source line 175. The bit line contact 185 extends through the first and second interlayer insulation layer 170 and 180 and contacts the source/drain region 160 at one side of the string select gate structure 130S. The bit line 190 is formed on the second interlayer insulation layer 180 and contacts the bit line contact 185. The bit line 190 extends in the first direction DA.

Figure 14B:
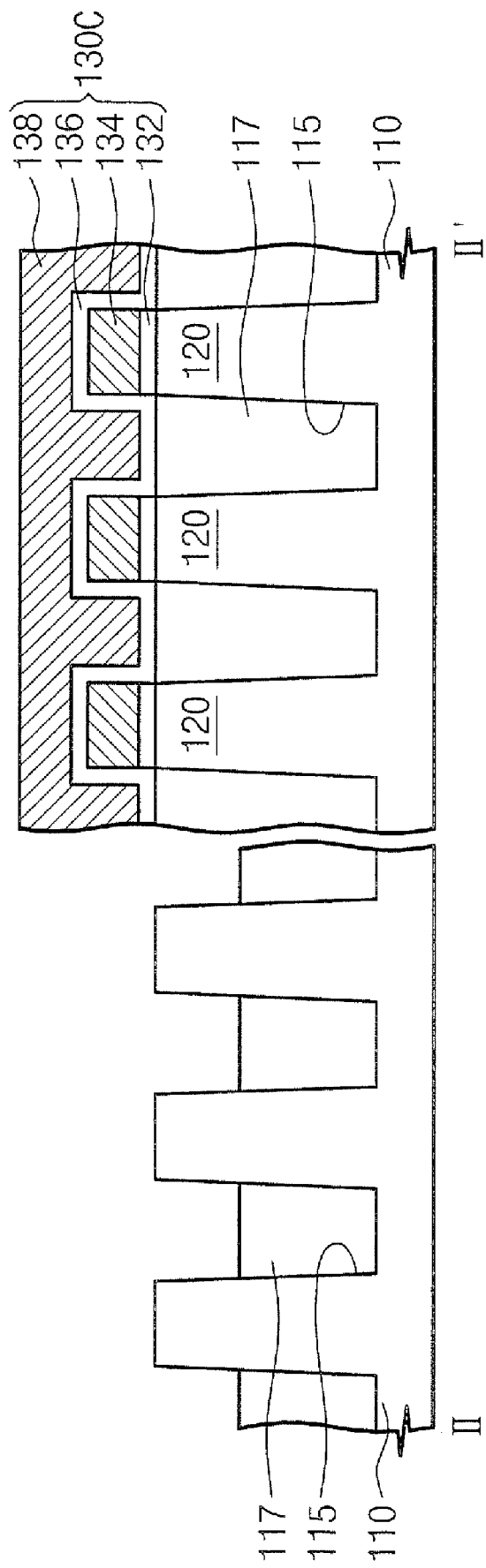
FIGS. 14B and 15B are sectional views taken along a line II-II' of FIG. 1, for illustrating a method of fabricating a non-volatile memory device according to other embodiments of the present invention.
Figure 15A:
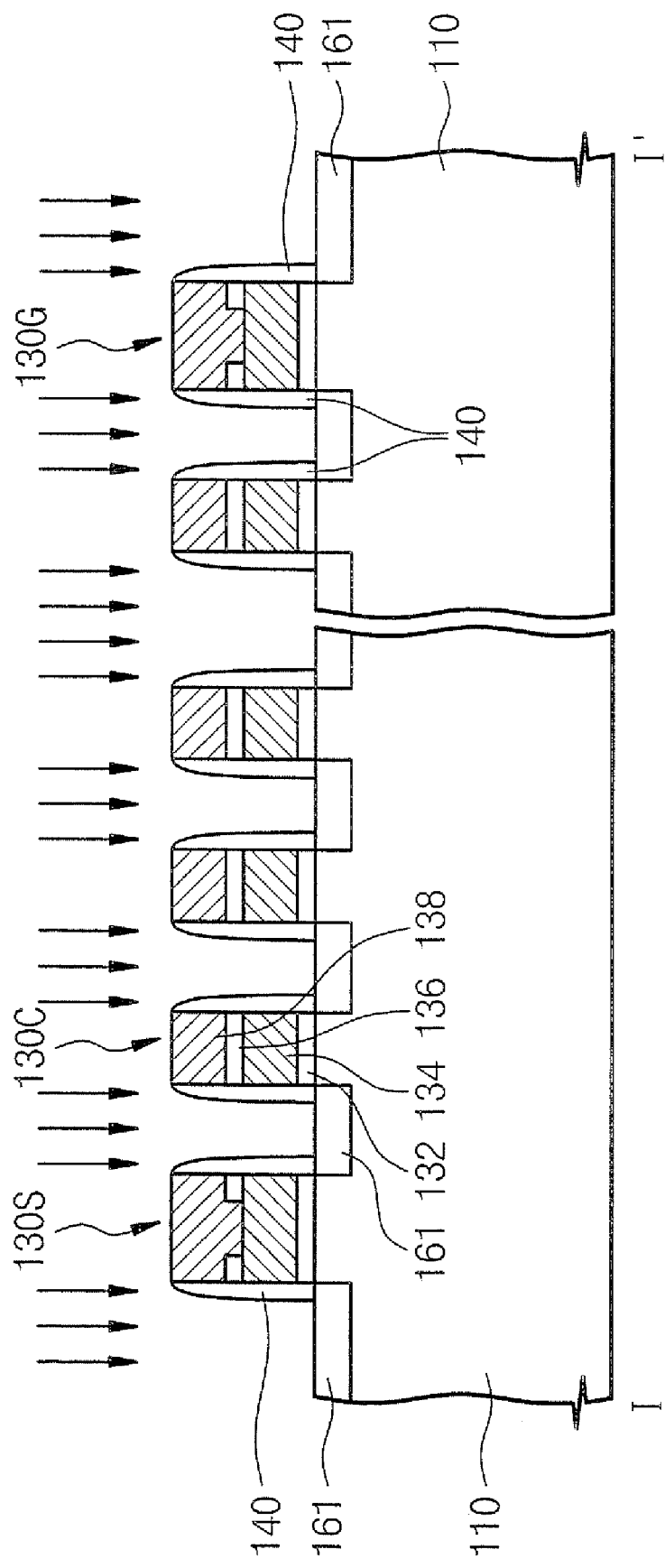
Figure 15B:
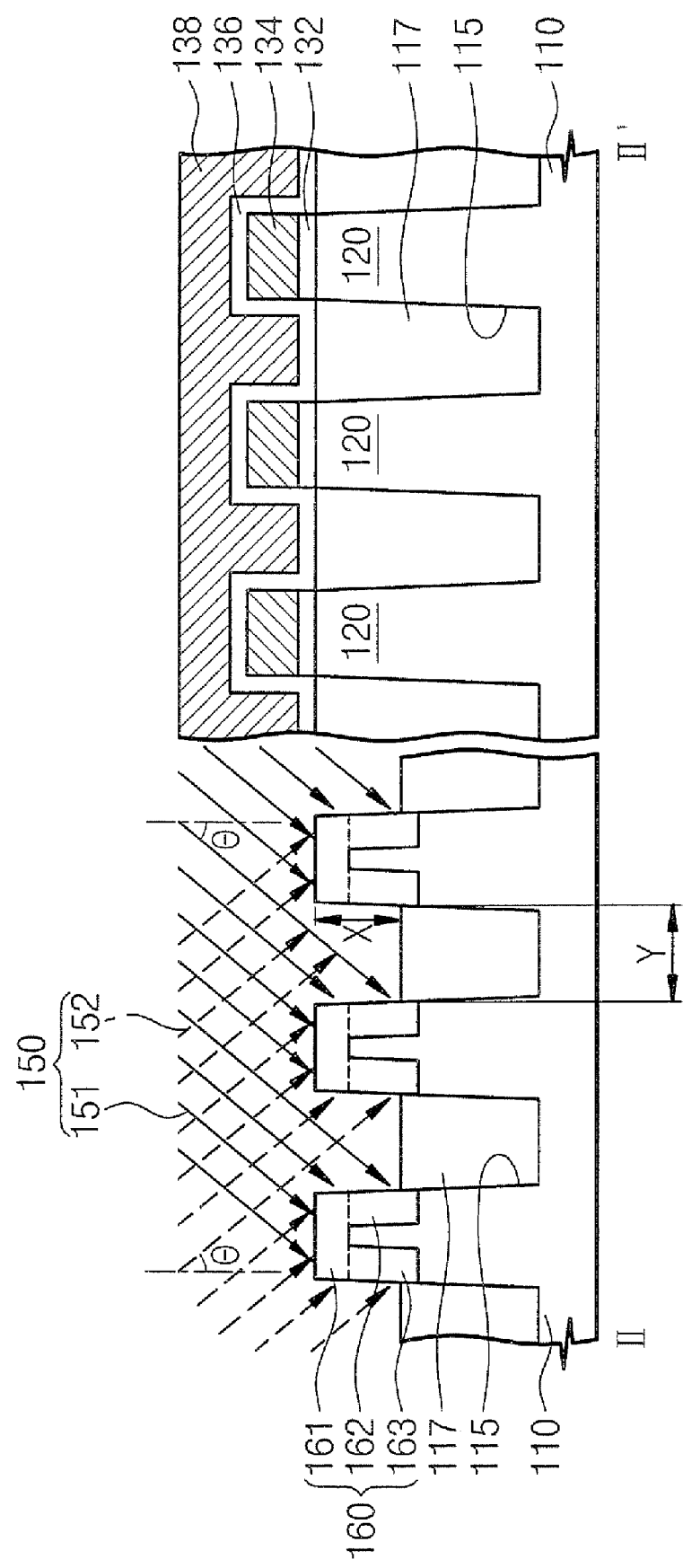

Referring to FIGS. 1, 14A, and 15B, a method of forming a non-volatile memory device according to other embodiments of the present invention will be described. Some of the portions of the description previously provided above with reference to FIGS. 9A through 12B may be similarly applied to this embodiment, and thus will be omitted for conciseness.

Referring to FIGS. 1, 14A, and 14B, a spacer mask 140 is formed to cover both side walls of the gate structures 130C, 130S, and 130G. The spacer mask 140 may be formed by performing an anisotropic process on the entire surface of the semiconductor substrate 110 after conformally forming an insulation layer on the semiconductor substrate 110 including the gate structures 130C, 130S, and 130G. The spacer mask 140 may be formed of a material having an etch selectivity with respect to the device isolation layer 117. Here, "having an etch selectivity" means that an etch rate difference is significant between the two layers to be etched. That is, if one layer has an etch rate that is relatively high or low with respect to another layer, the two layers have respectively different etch selectivities. For example, when the device isolation layer 117 is formed of silicon oxide, the spacer mask 140 may be formed of silicon nitride.

The device isolation layer 117 at both sides of the gate structures 130C, 130S, and 130G is etched by using the spacer mask 140 as an etching mask. Accordingly, the partially-recessed device isolation layer 117 is formed, and opposing side walls of the active region 120 at both sides of the gate structures 130C, 130S, and 130G are exposed. Etching conditions may be used to selectively etch the device isolation layer 117 with respect to the spacer mask 140 during the etching process. For example, when the device isolation layer 117 is an oxide layer and the spacer mask 140 is a nitride layer, the etching process may be a wet etching process using a hydrofluoric acid solution.

Referring to FIGS. 1, 15A, and 15B, an ion implantation process is performed to form the source/drain region 160 in the active region 120 at both sides of the gate structures 130C, 130S, and 130G. The source/drain region 160 may include a first impurity region 161 in the active region 120, and second impurity regions 162 and 163 at both sides of the active region 120 below the first impurity region 161. For example, the source/drain region 160 may have an inverted-"U" shaped cross section. However, the second impurity regions 162 and 163 may be electrically connected to each other because impurity ions may be diffused by a subsequent thermal treatment process.

The ion implantation process includes a first ion implantation process and a second ion implantation process. During the first and second ion implantation processes, impurity ions 150 are implanted into the semiconductor substrate 110 in a direction angled toward the second direction DW from a perpendicular direction with respect to the semiconductor substrate 110. That is, the implanted impurity ions 150 have an angle of incidence θ greater than 0° with reference to the direction perpendicular to the substrate 110. When a distance between the top surface of the active region 120 and the top surface of the recessed device isolation layer 117 is X and a width of the recessed device isolation layer 117 in the second direction DW is Y, the angle of incidence θ of the impurity ions implanted during the ion implantation process may be greater than 0° and less than about $\tan^{-1}(Y/X)$.

The first impurity ions 151 are implanted through the first ion implantation process to form the first impurity region 161 and the second impurity region 162 at one side of the active region 120. Additionally, the second impurity ions 152 are implanted through the second ion implantation process, in order to increase a doping concentration of the first impurity region 161. Therefore, the second impurity region 163 is formed at the other side of the active region 120. To form the stable and uniform source/drain region 160, the first and second impurity ions 151 and 152 may be symmetrically implanted to each other at the same angle of incidence θ. More particularly, the first impurity ions 151 may be implanted at an angle −θ, while the second impurity ions 152 may be implanted at an angle θ.

Because the impurity ions 150 implanted into the second impurity regions 162 and 163 do not need to penetrate through the device isolation layer 117 (in contrast to the above-described embodiments), the implantation energy and/or ion implantation depth Rp of the impurity ions 150 may be less than those of the above-described embodiments.

Because both the first and second impurity ions 151 and 152 are implanted into the first impurity region 161, a doping concentration of the first impurity region 161 may be greater than that of the second impurity regions 162 and/or 163 where only one of the first and second impurities 151 and 152 is implanted. For example, the doping concentration of the first impurity region 161 may be two or more times higher than that of the second impurity regions 162 and 163.

Referring to FIGS. 1, 3A, and 3B again, the first interlayer insulation layer 170 is disposed on the semiconductor substrate 110 having the source/drain region 160. The common source line 175 extends through the first interlayer insulation layer 170 and contacts the source/drain region 160 at one side of the ground select gate structure 130G. The common source line 175 extends in the second direction DW and the source/drain regions 160 at one side of the ground select gate structure 130G are electrically connected to each other through the common source line 175. The second interlayer insulation layer 180 is disposed on the first interlayer insulation layer 170 including the common source line 175. The bit line contact 185 extends through the first and second interlayer insulation layer 170 and 180 and contacts the source/drain region 160 at one side of the string select gate structure 130S. The bit line 190 is formed on the second interlayer insulation layer 180 and contacts the bit line contact 185. The bit line 190 extends in the first direction DA.

Referring to FIGS. 1 and 16A through 18B, a method of forming a non-volatile memory device according to further embodiments of the present invention will be described.

Figure 16A:
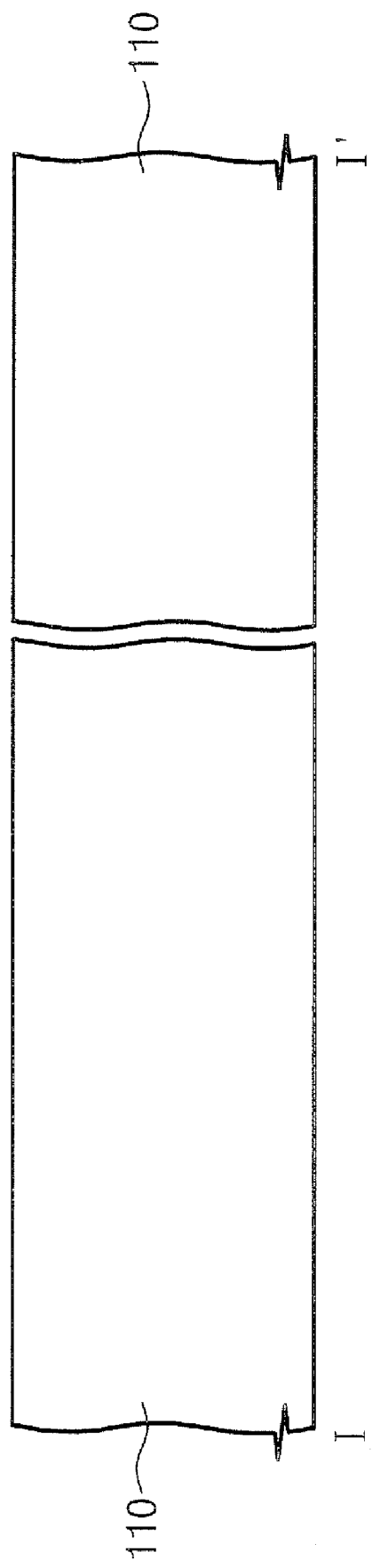
FIGS. 16A to 18A are sectional views taken along a line I-I' of FIG. 1 and FIGS. 16B to 18B are sectional views taken along a line II-II' of FIG. 1, for illustrating a method of fabricating a non-volatile memory device according to further embodiments of the present invention.
Figure 16B:
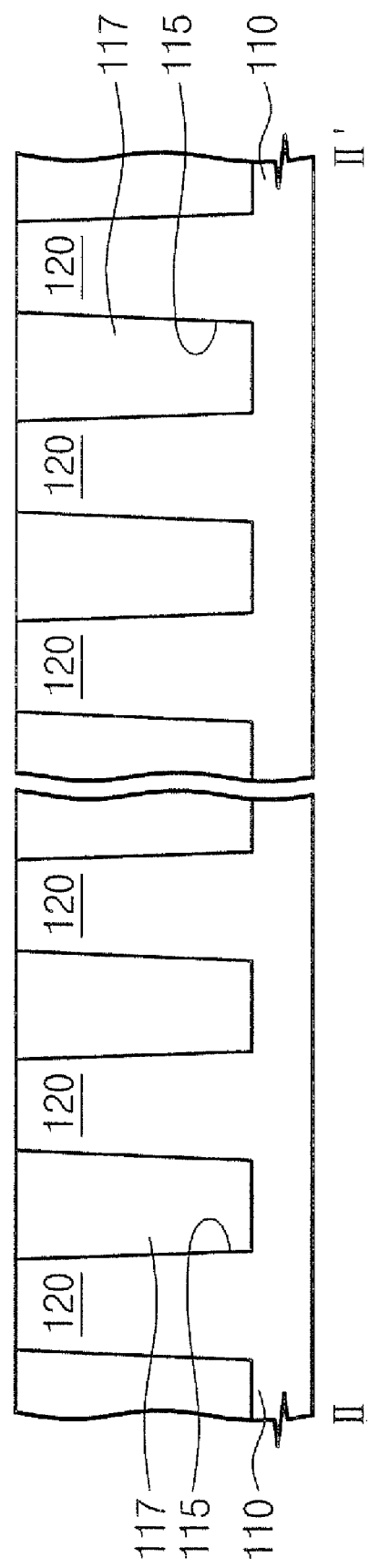

Referring to FIGS. 1, 16A, and 16B, the device isolation layer 117 is formed on the semiconductor substrate 110. The active region 120 extending in the first direction is defined. The device isolation layer 117 may be formed through a planarization process after filling the trench 115 for device isolation with an insulation layer.

Figure 17A:
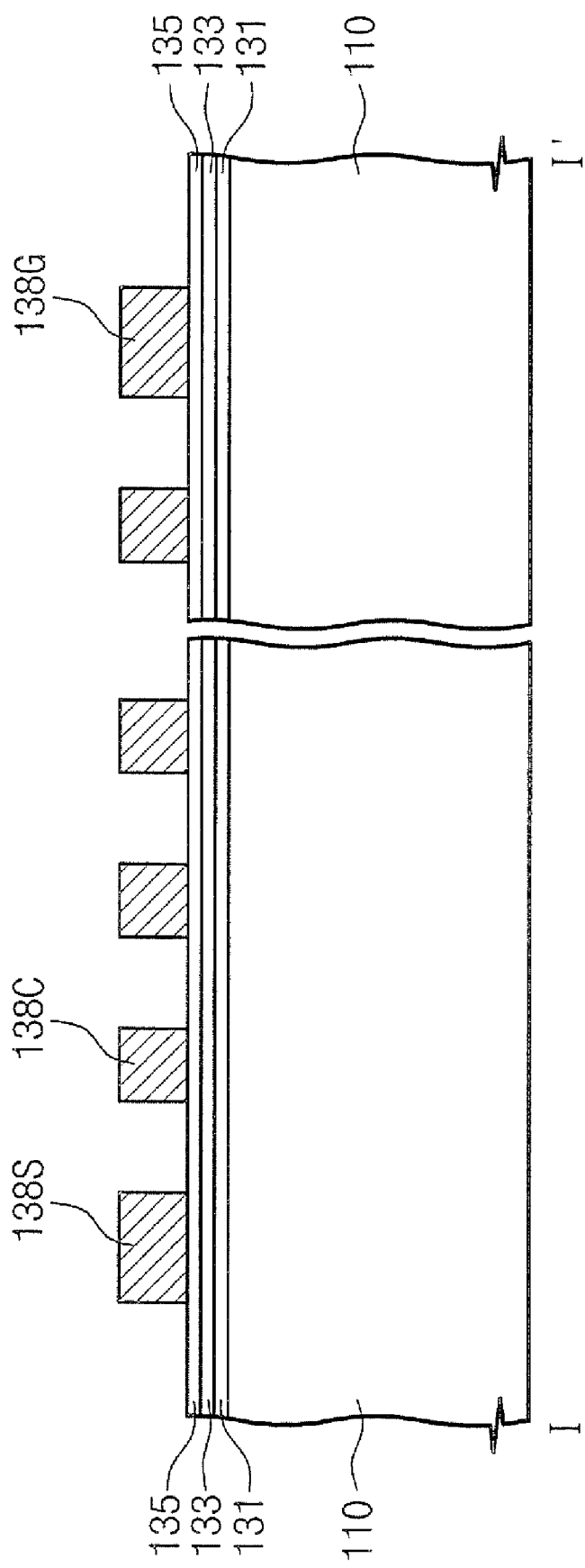

Referring to FIGS. 1, 17A, and 17B, the first insulation layer 131, the charge storage insulation layer 133, and the second insulation layer 135 are sequentially formed on the semiconductor substrate 110 including the device isolation layer 117. For example, the first insulation layer 131, the charge storage insulation layer 133, and the second insulation layer 135 may be an oxide layer, a nitride layer, and an oxide layer, respectively. Additionally, the second insulation layer 135 may be formed of a material having higher permittivity than the first insulation layer 131.

The control gate line 138C, the string select gate line 138S, the ground select gate line 138G, which extend in the second direction DW, are formed by forming a conductive layer on the second insulation layer and patterning it. The gate lines 138C, 138S, and 138G may include polysilicon and/or metal. Additionally, the metal may have a higher work function than polysilicon.

Figure 18A:
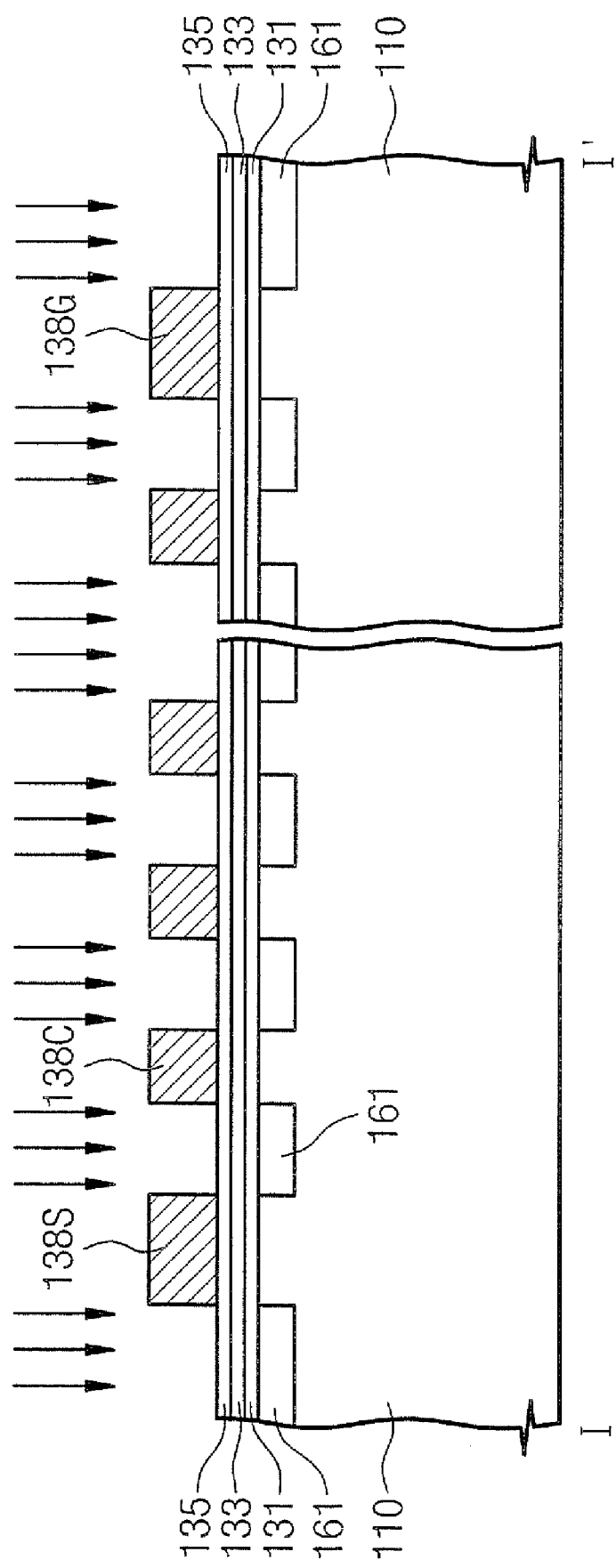
Figure 18B:
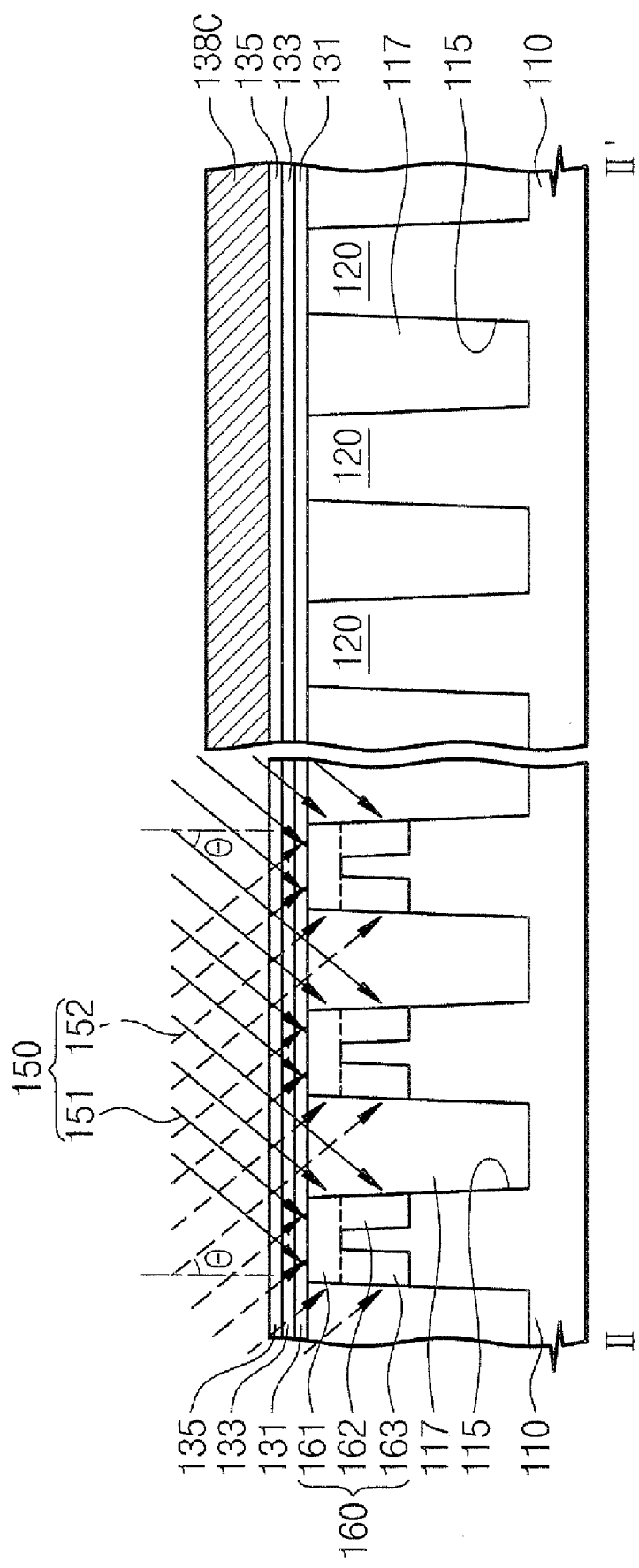

Referring to FIGS. 1, 18A, and 18B, the source/drain region 160 is formed in the active region 120 at both sides of the gate lines 138C, 138S, and 138G through an ion implantation process. The source/drain region 160 may include a first impurity region 161 in the active region 120, and second impurity regions 162 and 163 at both sides of the active region 120 below the first impurity region 161. For example, the source/drain region 160 may be formed to have an inverted-"U" shaped cross section. However, the second impurity regions 162 and 163 may be electrically connected to each other, because impurity ions may be diffused by a subsequent thermal treatment process.

The ion implantation process includes a first ion implantation process and a second ion implantation process. During the first and second ion implantation processes, impurity ions 150 are implanted into the semiconductor substrate 110 in a direction angled toward the second direction DW from a perpendicular direction with respect to the semiconductor substrate 110. That is, the implanted impurity ions 150 have an angle of incidence θ greater than about 0° with respect to a direction perpendicular to the substrate 110.

The first impurity ions 151 are implanted through the first ion implantation process to form the first impurity region 161 and the second impurity region 162 at one side of the active region 120. Additionally, the second impurity ions 152 are implanted through the second ion implantation process, in order to increase a doping concentration of the first impurity region 161. Therefore, the second impurity region 163 is formed at the other side of the active region 120. To form stable and uniform source/drain regions 160, the first and second impurity ions 151 and 152 may be symmetrically implanted to each other at the same (i.e., equal but opposite) angle of incidence θ.

Because the impurity ions 150 implanted into the second impurity regions 162 and 163 must penetrate through the device isolation layer 117, the implantation energy and/or ion implantation depth Rp can be appropriately adjusted in order to implant impurity ions 150 into both sides of the active region 120.

Because both the first and second impurity ions 151 and 152 are implanted into the first impurity region 161, a doping concentration of the first impurity region 161 may be greater than that of the second impurity regions 162 and/or 163 where only one of the first and second impurities 151 and 152 is implanted. For example, the doping concentration of the first impurity region 161 may be two or more times higher than those of the second impurity regions 162 and 163.

Again referring to FIGS. 1, 4A, and 4B, the first interlayer insulation layer 170 is disposed on the semiconductor substrate 110 having the source/drain region 160. The common source line 175 extends through the first interlayer insulation layer 170, the second insulation layer 135, the charge storage insulation layer 133, and the first insulation layer 131, and contacts the source/drain region 160 at one side of the ground select gate structure 130G. The common source line 175 extends in the second direction DW and the source/drain regions 160 at one side of the ground select gate structure 138G are electrically connected to each other through the common source line 175. The second interlayer insulation layer 180 is disposed on the first interlayer insulation layer 170 including the common source line 175. The bit line contact 185 extends through the first and second interlayer insulation layer 170 and 180, the second insulation layer 135, the charge storage insulation layer 133, and the first insulation layer 131, and contacts the source/drain region 160 at one side of the string select gate structure 130S. The bit line 190 is formed on the second interlayer insulation layer 180 and contacts the bit line contact 185. The bit line 190 extends in the first direction DA.

Referring to FIGS. 1, 19A through 21B, a method of forming a non-volatile memory device according to still other embodiments of the present invention will be described. Some portions of the description provided above with reference to FIGS. 16A through 17B in the above-described embodiments may be similarly applied to this embodiment, and thus will be omitted for conciseness.

Figure 19B:
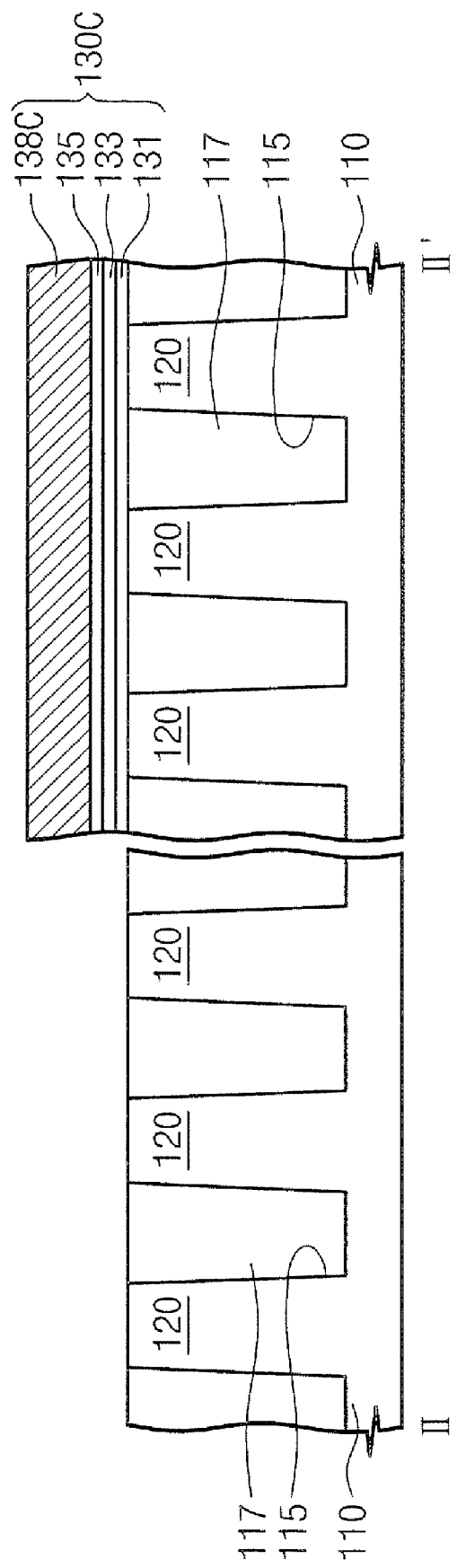
FIGS. 19A to 21A are sectional views taken along a line I-I' of FIG. 1 and FIGS. 19B to 21B are sectional views taken along a line II-II' of FIG. 1, for illustrating a method of fabricating a non-volatile memory device according to still other embodiments of the present invention.

Referring to FIGS. 1, 19A, and 19B, the second insulation layer 135, the charge storage insulation layer 133, and the first insulation layer 131 are patterned using the gate lines 138C, 138S, and 138G as an etching mask in order to form the gate structures 130C, 130S, and 130G including the first insulation layer pattern 132, the charge storage insulation layer pattern 134, the second insulation layer pattern 136, and the gate lines 138C, 139S, and 138G. That is, the cell gate structure 130C includes the first insulation layer pattern 132, the charge storage insulation layer pattern 134, the second insulation layer pattern 136, and the control gate line 138C. Additionally, the string select gate structure 130S includes the first insulation layer pattern 132, the charge storage insulation layer pattern 134, the second insulation layer pattern 136, and the string select gate line 138S. The ground select gate structure 130G includes the first insulation layer pattern 132, the charge storage insulation layer pattern 134, the second insulation layer pattern 136, and the ground select gate line 138G. The gate structures 130C, 130S, and 130G extend in the second direction, and portions of the active region 120 and the device isolation layer 117 at the both sides of the gate structures 130C, 130S, and 130G are exposed.

Figure 20A:
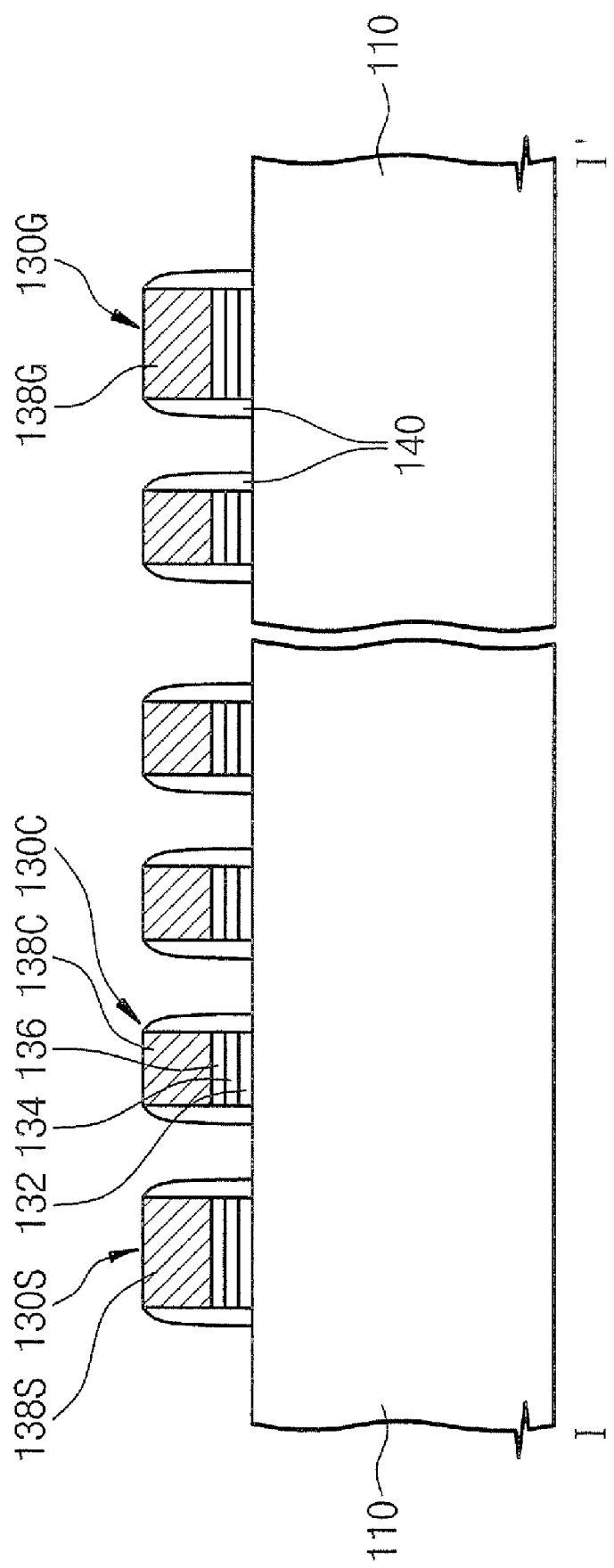

Referring to FIGS. 1, 20A, and 20B, the spacer mask 140 is formed to cover both side walls of the gate structures 130C, 130S, and 130G. The spacer mask 140 may be formed by performing an anisotropic etching process on the surface of the semiconductor substrate 110 after conformally forming the insulation layer on the semiconductor substrate 110 including the gate structures 130C, 130S, and 130G. The spacer mask 140 may be formed of a material having an etch selectivity with respect to the device isolation layer 117. For example, when the device isolation layer 117 is formed of silicon oxide, the spacer mask 140 may be formed of silicon nitride.

The device isolation layer 117 at both sides of the gate structures 130C, 130S, and 130G is etched by using the spacer mask 140 as an etching mask. Accordingly, the partially-recessed device isolation layer 117 is formed, and both side walls of the active region 120 at both sides of the gate structures 130C, 130S, and 130G are exposed. Etching conditions may be used to selectively etch the device isolation layer 117 with respect to the spacer mask 140 during the etching process. For example, when the device isolation layer 117 is an oxide layer and the spacer mask 140 is a nitride layer, the etching process may be a wet etching process using a hydrofluoric acid solution.

Figure 21B:
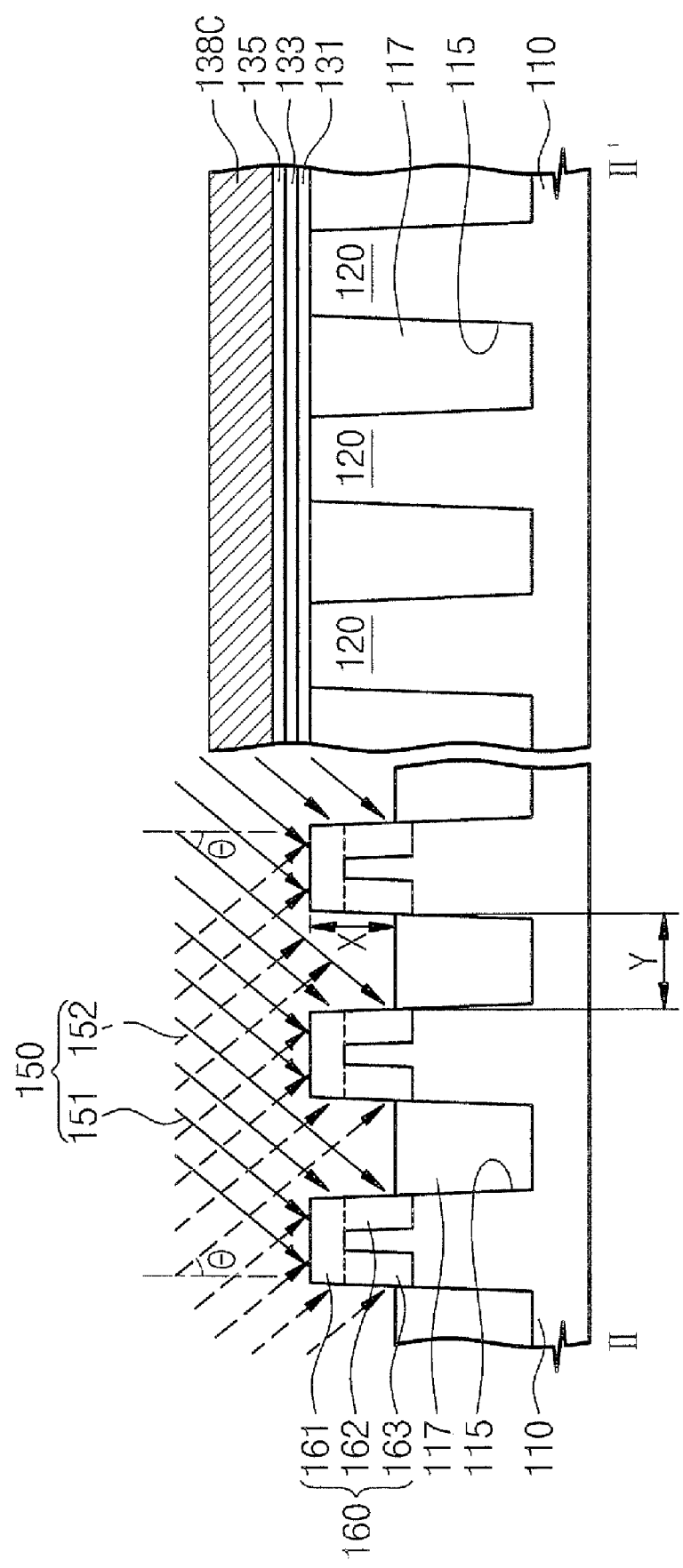

Referring to FIGS. 1, 21A, and 21B, an ion implantation process is performed to form the source/drain region 160 in the active region 120 at both sides of the gate structures 130C, 130S, and 130G. The source/drain region 160 may include a first impurity region 161 in the active region 120, and second impurity regions 162 and 163 at both sides of the active region 120 below the first impurity region 161. For example, the source/drain region 160 may have a cross section in an inverted-U shape. However, the second impurity regions 162 and 163 may be electrically connected to each other in some embodiments, because impurity ions may be diffused by a subsequent thermal treatment process.

The ion implantation process includes a first ion implantation process and a second ion implantation process. During the first and second ion implantation processes, impurity ions 150 are implanted into the semiconductor substrate 110 in a direction angled toward the second direction DW from a perpendicular direction with respect to the semiconductor substrate 110. That is, the implanted impurity ions 150 have an angle of incidence θ greater than 0° with respect to a direction perpendicular to the substrate 110. When a distance between the top surface of the active region 120 and the top surface of the recessed device isolation layer 117 is X and a width of the recessed device isolation layer 117 in the second direction DW is Y, the angle of incidence θ of the impurity ions implanted during the ion implantation process may be greater than 0° and less than about $\tan^{-1}(Y/X)$.

The first impurity ions 151 are implanted through the first ion implantation process to form the first impurity region 161 and the second impurity region 162 at one side of the active region 120. Additionally, the second impurity ions 152 are implanted through the second ion implantation process, in order to increase a doping concentration of the first impurity region 161. Therefore, the second impurity region 163 is formed at the other side of the active region 120. To form stable and uniform source/drain regions 160, the first and second impurity ions 151 and 152 may be symmetrically implanted to each other at equal but opposite angles of incidence θ and −θ.

Because the impurity ions 150 implanted into the second impurity regions 162 and 163 do not have to penetrate through the device isolation layer 117 (in contrast to some of the above-described embodiments), the implantation energy and/or ion implantation depth Rp of the impurity ions 150 may be smaller than those of the above-described embodiments.

Because the first and second impurity ions 151 and 152 are both implanted into the first impurity region 161, a doping concentration of the first impurity region 161 may be greater than the second impurity regions 162 and/or 163 where only one of the first and second impurities 151 and 152 is implanted. For example, the doping concentration of the first impurity region 161 may be two or more times higher than that of the second impurity regions 162 and 163.

Referring to FIGS. 1, 5A, and 5B again, the first interlayer insulation layer 170 is disposed on the semiconductor substrate 110 having the source/drain region 160. The common source line 175 extends through the first interlayer insulation layer 170 and contacts the source/drain region 160 at one side of the ground select gate structure 130G. The common source line 175 extends in the second direction DW and the source/drain regions 160 at one side of the ground select gate structure 130G are electrically connected to each other through the common source line 175. The second interlayer insulation layer 180 is disposed on the first interlayer insulation layer 170 including the common source line 175. The bit line contact 185 extends through the first and second interlayer insulation layer 170 and 180 and contacts the source/drain region 160 at one side of the string select gate structure 130S. The bit line 190 is formed on the second interlayer insulation layer 180 and contacts the bit line contact 185. The bit line 190 extends in the first direction DA.

Referring to FIGS. 1 and 22A through 24B, a method of forming a non-volatile memory device according to still further embodiments of the present invention will be described. Some portions of the description provided above with reference to FIGS. 16A through 17B may be similarly applied to this embodiment, and thus will be omitted for conciseness.

Figure 22A:
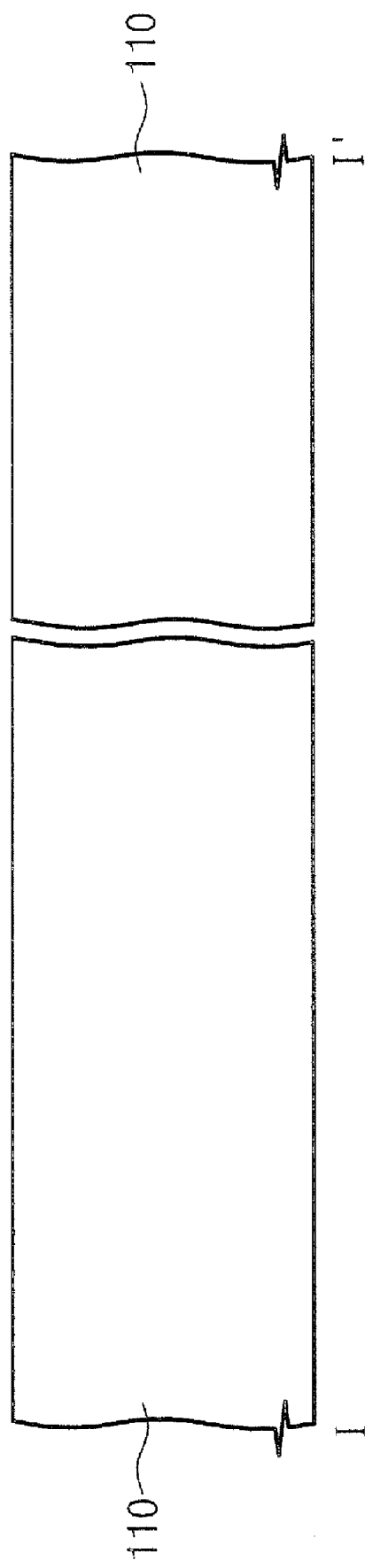

Referring to FIGS. 1, 22A, and 22B, the recessed device isolation layer 117 is formed by etching the device isolation layer 117, and opposing sidewalls of the active region are exposed. Etching conditions may be used to selectively etch the device isolation layer 117 with respect to the semiconductor substrate 140 during the etching process. For example, the etching process may be a wet etching process using a hydrofluoric acid solution.

Figure 23A:
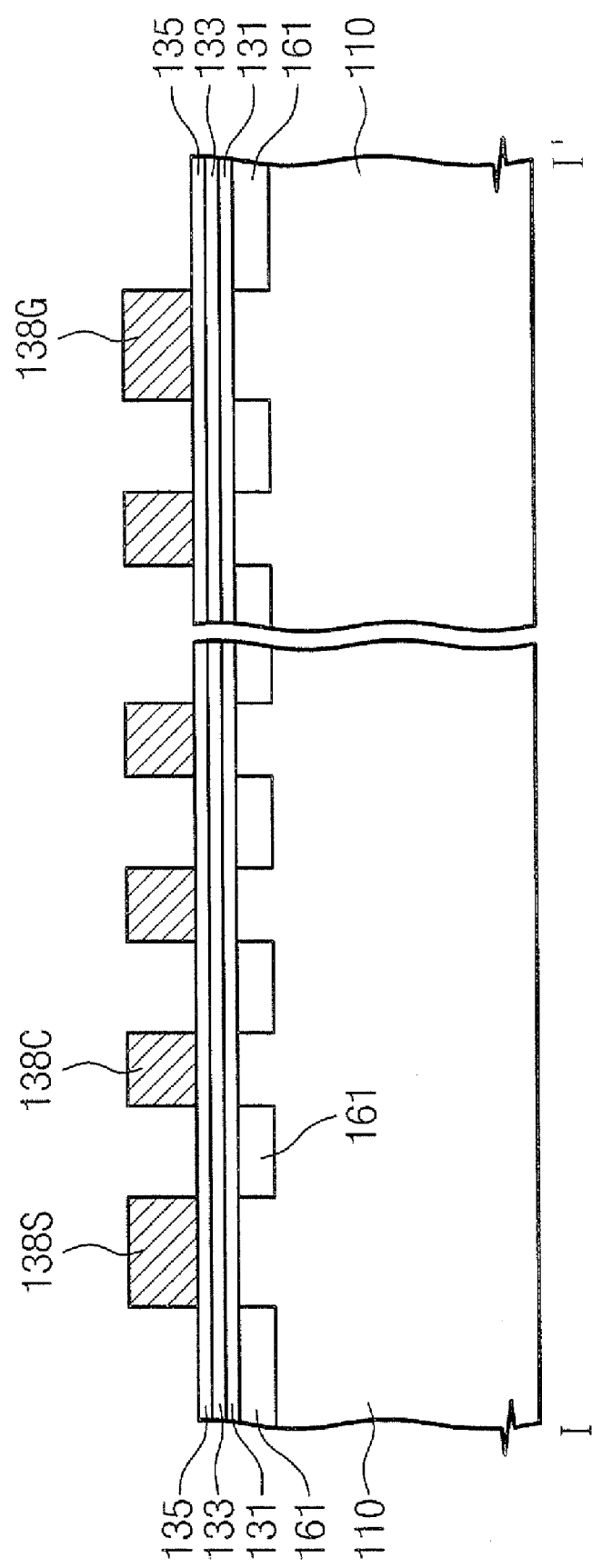
Figure 23B:
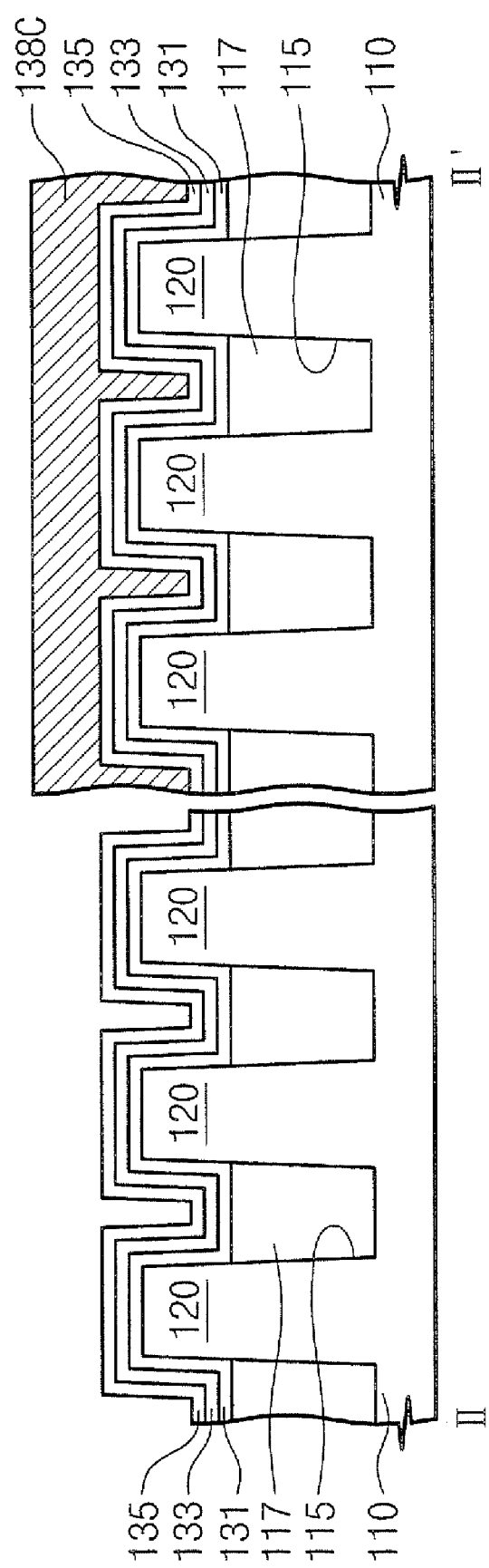

Referring to FIGS. 1, 23A, and 23B, the first insulation layer 131, the charge storage insulation layer 133, and the second insulation layer 135 are sequentially formed on the semiconductor substrate 110 including the device isolation layer 117. For example, the first insulation layer 131, the charge storage insulation layer 133, and the second insulation layer 135 may be an oxide layer, a nitride layer, and an oxide layer, respectively.

A control gate line 138C, a string select gate line 138S, a ground select gate line 138G, which extend in the second direction DW, are formed by forming a conductive layer on the second insulation layer 135 and patterning it. The gate lines 138C, 138S, and 138G may include polysilicon and/or metal.

According to some embodiments, the first insulation layer 131, the charge storage insulation layer 133, and the second insulation layer 135 are not patterned, but rather, are conformally formed on top surface and on sidewalls of the active region 120. However, the first insulation layer 131, the charge storage insulation layer 133, and the second insulation layer 135 can be patterned using the gate lines 138C, 138S, and 138G as an etching mask in other embodiments, as described above.

Figure 24A:
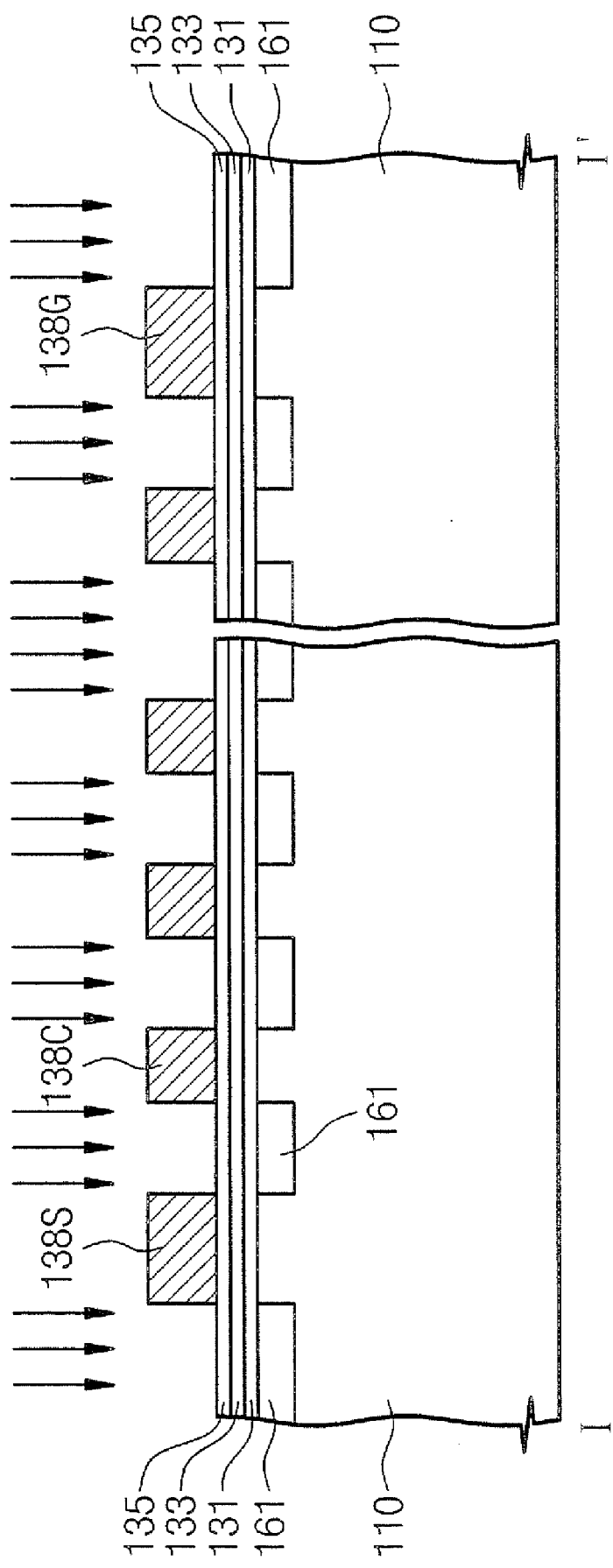
Figure 24B:
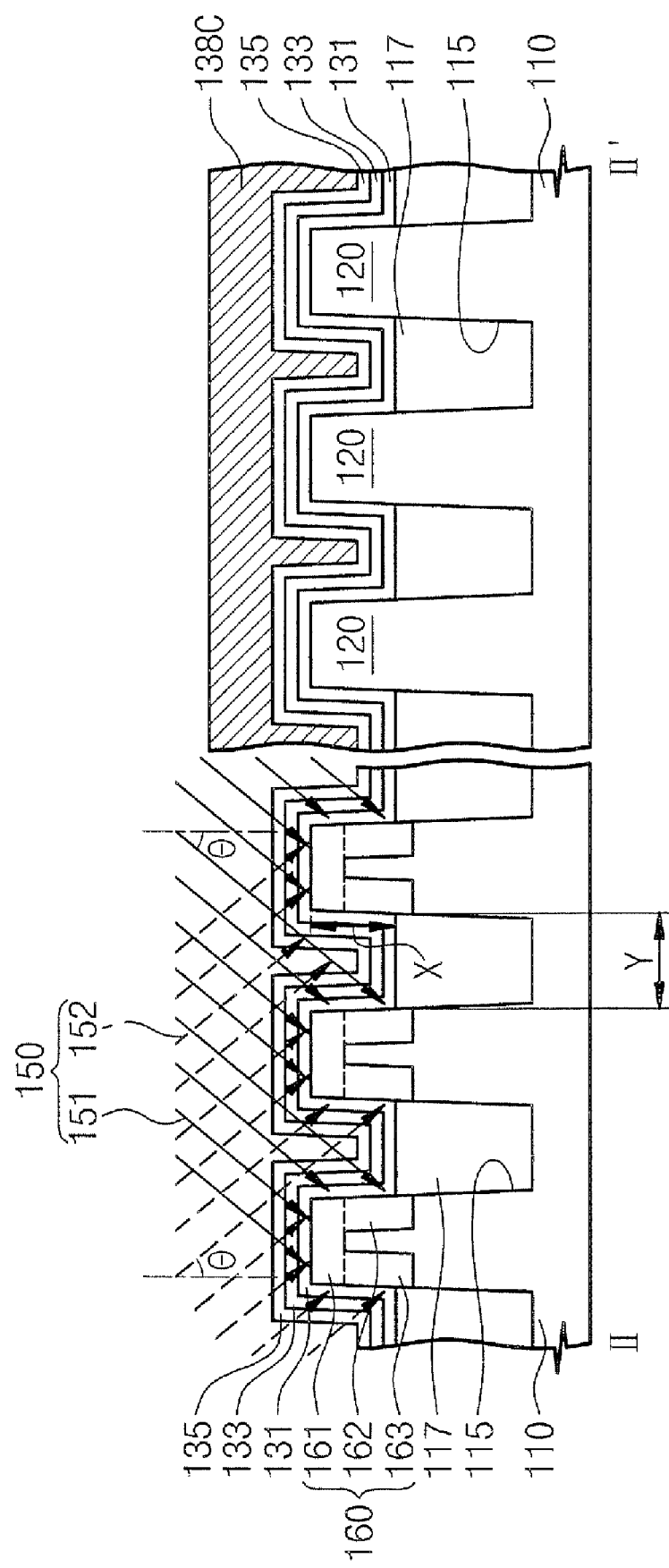

Referring to FIGS. 1, 24A, and 24B, the source/drain region 160 is formed in the active region 120 at both sides of the gate lines 138C, 138S, and 138G through an ion implantation process. The source/drain region 160 may include a first impurity region 161 in the active region 120, and second impurity regions 162 and 163 at both sides of the active region 120 below the first impurity region 161. For example, the source/drain region 160 may be formed to have a cross section in an inverted-U shape. However, the second impurity regions 162 and 163 may be electrically connected to each other in some embodiments, because impurity ions may be diffused by a subsequent thermal treatment process.

The ion implantation process includes a first ion implantation process and a second partially overlapping ion implantation process. During the first and second ion implantation processes, impurity ions 150 are implanted into the semiconductor substrate 110 angled toward the second direction DW from a perpendicular direction with respect to the semiconductor substrate 110. That is, the implanted impurity ions 150 have an angle of incidence θ greater than 0° with respect to a perpendicular to the substrate 110. For example, when a distance between the top surface of the active region 120 and the top surface of the recessed device isolation layer 117 is X and a width of the recessed device isolation layer 117 in the second direction DW is Y, the angle of incidence θ of the impurity ions implanted during the ion implantation process may be greater than θ and less than about $\tan^{-1}(Y/X)$.

The first impurity ions 151 are implanted through the first ion implantation process to form the first impurity region 161 and the second impurity region 162 at one side of the active region 120. Additionally, the second impurity ions 152 are implanted through the second ion implantation process, in order to increase a doping concentration of the first impurity region 161. Therefore, the second impurity region 163 is formed at the other side of the active region 120. To form stable and uniform source/drain regions 160, the first and second impurity ions 151 and 152 may be symmetrically implanted to each other at equal but opposite angles of incidence θ and −θ.

The impurity ions 150 implanted into the second impurity regions 162 and 163 must penetrate through the second insulation layer 135, the charge storage insulation layer 133, and the first insulation layer 131 except for the device isolation layer 117, unlike some of the above-described embodiments. Thus, the implantation energy and/or ion implantation depth Rp of the impurity ions 150 can be appropriately adjusted by considering the above fact.

Because both the first and second impurity ions 151 and 152 are implanted into the first impurity region 161, a doping concentration of the first impurity region 161 may be greater than the second impurity regions 162 and/or 163 where only one of the first and second impurities 151 and 152 is implanted. For example, the doping concentration of the first impurity region 161 may be two and more times higher than those of the second impurity regions 162 and 163.

Referring to FIGS. 1, 6A, and 6B again, the first interlayer insulation layer 170 is disposed on the semiconductor substrate 110 having the source/drain region 160. The common source line 175 extends through the first interlayer insulation layer 170 and contacts the source/drain region 160 at one side of the ground select gate structure 130G. The common source line 175 extends in the second direction DW and the source/drain regions 160 at one side of the ground select gate structure 130G are electrically connected to each other through the common source line 175. The second interlayer insulation layer 180 is disposed on the first interlayer insulation layer 170 including the common source line 175. The bit line contact 185 extends through the first and second interlayer insulation layer 170 and 180, the second insulation layer 135, the charge storage insulation layer 133, and the first insulation layer 131, and contacts the source/drain region 160 at one side of the string select gate structure 130S. The bit line 190 is formed on the second interlayer insulation layer 180 and contacts the bit line contact 185. The bit line 190 extends in the first direction DA.

Figure 25:
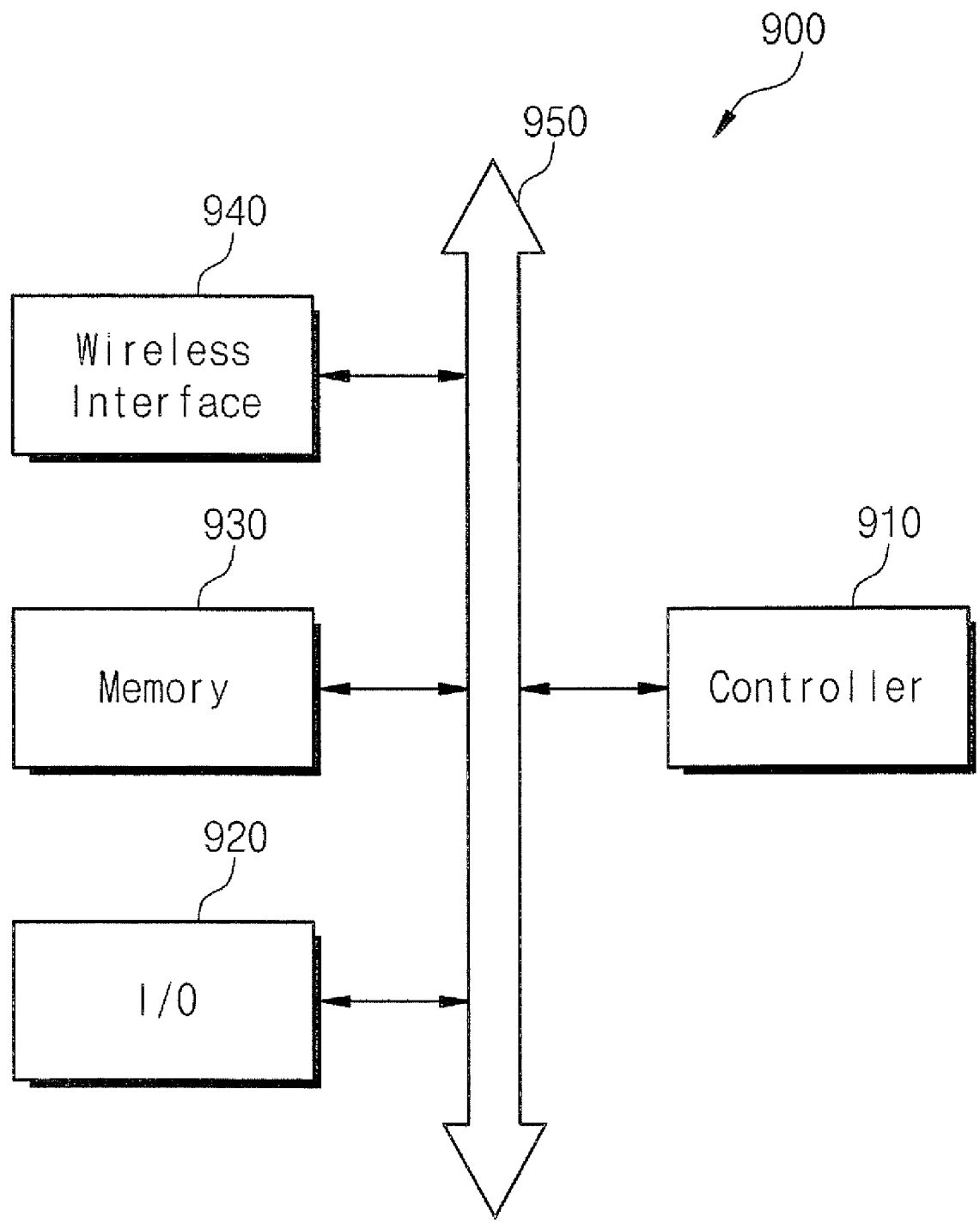
FIG. 25 is a view of an electronic device including a non-volatile memory device according to some embodiments of the present invention.

Referring to FIG. 25, an electronic device 900 is described, which includes a non-volatile memory device according to some embodiments of the present invention. The electronic device 900 may be used in PDAs, laptop computers, portable computers, web tablets, wireless phones, mobile phones, digital music players, or all devices transmitting and receiving data in wireless environments.

The electronic device 900 includes a controller 910, an input/output device (e.g., a keypad, a keyboard, and/or a display), a memory 930, and/or a wireless interface 940, which are connected through a bus 950. The controller 910 may include at least one of a microprocessor, a digital signal processor, a microcontroller, or any devices similar thereto. The memory 930 can be used for storing commands that will be executed by the controller 910. Also, the memory 930 can be used for storing user data. The memory 930 includes the non-volatile memory device according to some embodiments of the present invention. The memory 930 may further include different kinds of memories, arbitrarily accessible volatile memories, and other various kinds of memories.

The electronic device 900 may use a wireless interface 940 to transmit or receive data to or from a wireless communication network. For example, the wireless interface 940 may include antenna, a wireless transceiver, etc.

The electronic device 900 according to some embodiments of the present invention can be used for a communication interface protocol of the third generation communication such as code division multiple access (CDMA), group special mobile (GSM), North American digital communications (NADC), enhanced time division multiple access (E-TDMA), wideband CDMA (WCDMA), CDMA 2000, etc.

According to embodiments of the present invention, a memory cell transistor requiring program inhibition can be effectively program-inhibited. Accordingly, reliability and/or operational characteristics of a non-volatile memory device can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A method of fabricating a semiconductor device, the method comprising:

forming an active region including opposing sidewalls and a top surface therebetween protruding from a substrate, the active region extending in a first direction;

forming a device isolation layer on the opposing sidewalls of the active region;

forming a gate structure crossing over the active region and extending in a second direction intersecting the first direction;

recessing the device isolation layer at opposite sides of the gate structure to expose portions of the opposing sidewalls of the active region and to define a recessed device isolation layer covering remaining portions of the opposing sidewalls of the active region; and forming source/drain regions in the active region, the source/drain regions respectively comprising a first impurity region in the top surface of the active region and second impurity regions in the exposed portions of the opposing sidewalls of the active region, the first impurity region having a doping concentration that is greater than that of the second impurity regions.

2. The method of claim 1, wherein forming the source/drain regions comprises:

implanting impurity ions into the active region at an angle of greater than 0 degrees with respect to a direction perpendicular to the top surface of the active region.

3. The method of claim 1, wherein forming the source/drain regions comprises:

performing a first ion implantation process to implant first impurity ions into a first one of the opposing sidewalls of the active region and into the top surface of the active region adjacent thereto; and performing a second ion implantation process to implant second impurity ions into a second one of the opposing sidewalls of the active region and into the top surface of the active region adjacent thereto, wherein the top surface of the active region implanted with the first and second impurity ions defines the first impurity region, and wherein the first one of the opposing sidewalls of the active region implanted with the first impurity ions and the second one of the opposing sidewalls of the active region implanted with the second impurity ions define the second impurity regions.

4. The method of claim 3, wherein the first impurity ions and the second impurity ions are respectively implanted from opposite directions at substantially similar angles of incidence with respect to a direction perpendicular to the top surface of the active region.

5. The method of claim 4, wherein the second impurity regions extend towards the substrate beyond a top surface of the recessed device isolation layer.

6. The method of claim 5, wherein the angle of incidence is greater than 0° and less than $\tan^{-1}(Y/X)$, wherein X is a distance between the top surface of the active region and the top surface of the recessed device isolation layer, and wherein Y is a width of the recessed device isolation layer along the second direction perpendicular to the first direction in which the active region extends.

7. The method of claim 5, wherein forming the gate structure comprises:

forming a conductive pattern extending in the first direction on the active region interposing a first insulation layer between the active region and the conductive pattern;

forming a conductive layer interposing a second insulation layer between the conductive pattern and the conductive layer; and patterning the conductive layer, the second insulation layer, the conductive pattern, and the first insulation layer to form the gate structure including a conductive line, a second insulation layer pattern, a floating gate, and a first insulation layer pattern.

8. The method of claim 7, further comprising the following before performing the first and second ion implantation processes:

forming spacer masks on opposing sidewalls of the gate structure; and recessing the device isolation layer between the spacer masks using the spacer masks as an etching mask to expose portions of the opposing sidewalls of the active region.

9. The method of claim 8, wherein the spacer masks comprise a material having an etch selectivity with respect to the device isolation layer, and wherein recessing the device isolation layer is performed using a wet etching process.

10. The method of claim 5, wherein forming the gate structure comprises:

forming a first insulation layer, a charge storage insulation layer, and a second insulation layer in sequence on the active region to define a charge storage layer;

forming a conductive layer on the second insulation layer; and then patterning the conductive layer to form a conductive line.

11. The method of claim 10, wherein forming the gate structure further comprises:

patterning the second insulation layer, the charge storage insulation layer, and the first insulation layer using the conductive line as an etching mask to form the gate structure including the conductive line, a second insulation layer pattern, a charge storage insulation layer pattern, and a first insulation layer pattern.

12. The method of claim 11, further comprising:

forming spacer masks on opposing sidewalls of the gate structure, wherein recessing the device isolation layer comprises recessing the device isolation layer between the spacer masks using the spacer masks as an etching mask to expose the portions of the opposing sidewalls of the active region.

13. The method of claim 12, wherein the spacer masks comprise a material having an etch selectivity with respect to the device isolation layer, and wherein recessing the device isolation layer is performed using a wet etching process.

* * * * *